(12) United States Patent
Duraffourg et al.

(10) Patent No.: US 8,310,320 B2
(45) Date of Patent: Nov. 13, 2012

(54) MAGNETIC NANO-RESONATOR

(75) Inventors: Laurent Duraffourg, Voiron (FR);
Philippe Andreucci, Moirans (FR); Lise Bilhaut, Grenoble (FR); Bernard Viala, Sassenage (FR)

(73) Assignee: Commissariat a l'Energie Atomique, Paris (FR)

( * ) Notice: Subject to any disclaimer, the term of this patent is extended or adjusted under 35 U.S.C. 154(b) by 434 days.

(21) Appl. No.: 12/412,865

(22) Filed: Mar. 27, 2009

(65) Prior Publication Data

US 2009/0289747 A1 Nov. 26, 2009

(30) Foreign Application Priority Data

Mar. 28, 2008 (FR) .................................. 08 52062

(51) Int. Cl.
*H03H 9/24* (2006.01)

(52) U.S. Cl. .................. 333/186; 333/200; 333/219.2; 977/724; 977/932

(58) Field of Classification Search .............. 333/186, 333/200, 19.22, 219.2; 977/724, 732, 733, 977/932, 953
See application file for complete search history.

(56) References Cited

U.S. PATENT DOCUMENTS

| 4,369,567 A * | 1/1983 | Bosch et al. ............... 29/607 |
| 5,963,857 A * | 10/1999 | Greywall ................ 455/307 |
| 6,346,189 B1 * | 2/2002 | Dai et al. .................. 205/766 |
| 6,392,776 B1 * | 5/2002 | Murakami et al. ........ 359/224.1 |
| 6,593,731 B1 | 7/2003 | Roukes et al. |
| 6,819,103 B2 * | 11/2004 | Champion et al. .......... 324/260 |
| 6,835,926 B2 * | 12/2004 | Weitekamp et al. .......... 250/234 |
| 6,947,719 B2 * | 9/2005 | Buchaillot et al. ............ 455/307 |
| 7,075,298 B2 * | 7/2006 | Mityushin et al. ........... 324/303 |
| 7,471,083 B1 * | 12/2008 | Joshi ............................ 324/244 |
| 7,642,692 B1 * | 1/2010 | Pulskamp .................... 310/309 |
| 7,915,973 B2 * | 3/2011 | Zettl et al. .................... 333/186 |
| 2002/0017134 A1 * | 2/2002 | Sakurai et al. ............. 73/504.02 |
| 2002/0092359 A1 * | 7/2002 | Lange et al. .................... 73/779 |
| 2002/0153583 A1 | 10/2002 | Frazier et al. |
| 2004/0244488 A1 * | 12/2004 | Tang et al. ....................... 73/579 |
| 2006/0007514 A1 * | 1/2006 | Desai ............................ 359/224 |
| 2006/0139842 A1 | 6/2006 | Shim et al. |
| 2007/0057278 A1 | 3/2007 | Nakamura et al. |
| 2007/0075806 A1 * | 4/2007 | Naito et al. ................... 333/186 |
| 2007/0164839 A1 * | 7/2007 | Naito ........................... 333/186 |

(Continued)

FOREIGN PATENT DOCUMENTS

WO    WO 03061470 A1    7/2003

(Continued)

OTHER PUBLICATIONS

S.C. Jun et al.; "Evaluation of 3C-SiC Nanomechanical Resonators Using Room Temperature Magnetomotive Transduction"; Nanoscale Science and Engineering Initiative of the National Science Foundation, published in IEEE 2005 Sensors, pp. 1042-1045, Oct. 30-Nov. 3, 2005.*

(Continued)

*Primary Examiner* — Barbara Summons
(74) *Attorney, Agent, or Firm* — Nixon Peabody LLP

(57) ABSTRACT

A nano-resonator device comprising at least one fixed element and at least one mobile element with respect to the fixed element, first electromagnetic means, integrated or fixed on the fixed element, and second electromagnetic means, integrated or fixed on the mobile element, to generate an oscillating movement of the mobile element.

40 Claims, 21 Drawing Sheets

U.S. PATENT DOCUMENTS

2008/0297276 A1 * 12/2008 Jun et al. ............... 333/186

FOREIGN PATENT DOCUMENTS

WO     WO 2006076037 A2    7/2006

OTHER PUBLICATIONS

Abele, N. et al., Comparison of RSG-MOSFET and capacitive MEMS resonator detection, Electronics Letters, Mar. 3, 2005, vol. 41, No. 5, 2 pages.

Agache, V. et al., Fabrication and characterization of 1.1 GHz blade nanoelectromechanical resonator, Applied Physics Letters, No. 86, 2005, pp. 213104-1-213104-3, published online May 16, 2005.

Arcamore, J. et al., A compact and low-power CMOS circuit for fully integrated NEMS resonators, IEEE Transactions on Circuits and Systems, vol. 54, No. 5, May 2007, pp. 377-381.

Beunder, Mike A. et al., A new embedded NVM technology for low-power, high temperature, rad-hard applications, IEEE, 2005, pp. 65-68.

Cavendish Kinetics News, Embedding memory, 2006, 2 pages, published online at www.cavendish-kinetics.com.

Chimot, N. et al., Gigahertz frequency flexible carbon nanotube transistors, Applied Physics Letters, No. 91, 2007, pp. 153111-1-15311-13, published online Oct. 10, 2007.

Cleland, A. N. et al., Fabrication of high frequency nanometer scale mechanical resonators from bulk Si crystals, Applied Physics Letters No. 69 (18) Oct. 18, 1996, pp. 2653-2655.

Deshpande, V.V. et al., Carbon nanotube linear bearing nanoswitches, Nano Letters, vol. 6, No. 6, 2006, pp. 1092-1095.

Dujardin, E. et al., Self-assembled switches based on electroactuated multiwalled nanotubes, Applied Physics Letters No. 87, 2005, pp. 193107-1-193107-3, published online Nov. 3, 2005.

Ekinci, K. L. et al., Ultrasensitive nanoelectromechanical mass detection, Applied Physics Letters, vol. 84, No. 22, May 31, 2004, pp. 4469-4471.

Grate, Jay W. et al., Hybrid organic/inorganic copolymers with strongly hydrogen-bond acidic properties for acoustic wave and optical sensors, Chem. Mater., No. 9, 1997, pp. 1201-1207.

Ilic, B. et al., Virus detection using nanoelectromechanical devices, Applied Physics Letters, vol. 85, No. 13, Sep. 27, 2004, pp. 2604-2606.

Jang, J.E. et al., Nanoelectromechanical DRAM for ultra-large-scale integration (ULSI), IEEE, 2005, 4 pages. International electron devices meeting, IEDM Technical Digest.

Koskenvuori, M. et al., Temperature measurement and compensation based on two vibrating modes of a bulk acoustic mode microresonator, IEEE MEMS, Tucson AZ, Jan. 13-17, 2008, pp. 78-81.

Magfusion, Inc., A magnetic MEMS-based RF relay, Microwave Journal, Horizon House Publications, 2004, 5 pages; Jan. 28, 2004.

Matsuura, Tsukasa et al., Silicon micro optical switching device with an electromagnetically operated cantilever, Sensors and Actuators, 83, 2000, pp. 220-224.

Nguyen, Clark T.-C. et al., An integrated CMOS micromechanical resonator high-Q oscillator, IEEE Journal ofSolid-State Circuits, vol. 34, No. 4, Apr. 1999, pp. 440-455.

Nguyen, Clark T.-C., Vibrating RF MEMS for next generation wireless applications, IEEE Custom Integrated Circuits Conference, 2004, pp. 256-264.

Pourkamali, Siavash et al., 18 um thick high frequency capacitive HARPSS resonators with reduced motional resistance, Solid-State Sensor, Actuator and Microsystems Workshop, Hilton Head Island, SC, Jun. 6-10, 2004, pp. 391-393.

Pourkamali, Siavash et al., Vertical capacitive SiBARS, IEEE, 2005, pp. 211-214, of the IEEE 18th International Conference on MEMS, Jul. 5, 2005.

Prejbeanu, I. L. et al., Thermally assisted switching in exchange-biased storage layer magnetic tunnel junctions, IEEE Transactions on Magnetics, vol. 40, No. 4, Jul. 2004, pp. 2625-2627.

Prejbeanu, I. L. et al., Thermally assisted MRAM, Journal of Physics: Condensed Matter, 19, 2007, pp. 1-23., published Apr. 6, 2007.

Ruan, M. et al., Latching microelectromagnetic relays, Sensors and Actuators, A 91, 2001, pp. 346-350.

Rueckes, Thomas et al., Carbon nanotube-based nonvolatile random access memory for molecular computing, Science, vol. 289, Jul. 7, 2000, pp. 94-97.

Sazonova, Vera et al., A turnable carbon nanotube electromechanical oscillator, Nature, vol. 431, Sep. 16, 2004, pp. 284-287.

Sort, J, et al., Exchange bias in antiferromagnetic-ferromagnetic-antiferromagnetic structures with out-of-plane magnetization, Physical Review, B 72, 104412, 2005, pp. 104412-1-104412-6, Sep. 8, 2005.

Voicelescu, Ioana et al., Electrostatically actuated resonant microcantilever beam in CMOS technology for the detection of chemical weapons, IEEE Sensors Journal, vol. 5, No. 4, Aug. 2005, pp. 641-647.

Wang, C. et al., Ultrasensitive biochemical sensors based on microcantilevers of atomic force microscope,Analytical Biochemistry, 363, 2007, pp. 1-11.

Wang, J. et al., 1.156-GHz self-aligned vibrating micromechanical disk resonator, IEEE Transactions on Ultrasonics, Ferroelectrics, and Frequency Control, vol. 51, No. 12, Dec. 2004, pp. 1607-1628.

Ward, J. W. et al., A non-volatile nanoelectromechanical memory element utilizing a fabric of carbon nanotubes, IEEE, 2004, pp. 34-38.

Zalalutdinov, M. et al., Frequency-tunable micromechanical oscillator, Applied Physics Letters, vol. 77, No. 20, Nov. 13, 2000, pp. 3287-3289.

Zhang, Yonghua et al., Design and analysis of the micromechanical structure for an electromagnetic bistable RF MEMS switch, IEEE, APMC2005 Proceedings, 2005, 4 pages.

Zhang, Yonghua et al., Low-stress permalloy for magnetic MEMS switches, IEEE Transactions on Magnetics, vol. 42, No. 1, Jan. 2006, pp. 51-55.

Ziegler, Kirk J. et al., Bistable nanoelectromechanical devices, Applied Physics Letters, vol. 84, No. 20, May 17, 2004, pp. 4074-4076.

Cleland, A.N. et al., "External control of dissipation in a nonometer-scale radiofrequency mechanical resonator". Sensors and Actuators, 72, pp. 256-261 (1999).

Lin, Yu-Wei et al., "60-MHz Wine-Glass Micromechanical-Disk Reference Oscillator", IEEE ISSCC, Session 17, Mems and Sensors, 17.7, 10 pages (2004).

Lin, Yu-Wei et al., "Series-Resonant VHF Micromechanical Resonator Reference Oscillators", IEEE Journal of Solid-State Circuits, vol. 39, No. 12, pp. 2477-2491 (Dec. 2004).

Liu, Chang, "Micromachined Magnetic Actuators Using Electroplated Permalloy", IEEE Transactions on Magnetics, vol. 35, No. 3, pp. 1976-1985 (May 1999).

Lovellette, M.N. et al., "Nanotube Memories for Space Applications", IEEE Aerospace Conference Proceedings, pp. 2300-2305 (2004).

French Preliminary Search Report, FR 0852062, dated Nov. 13, 2008.

* cited by examiner

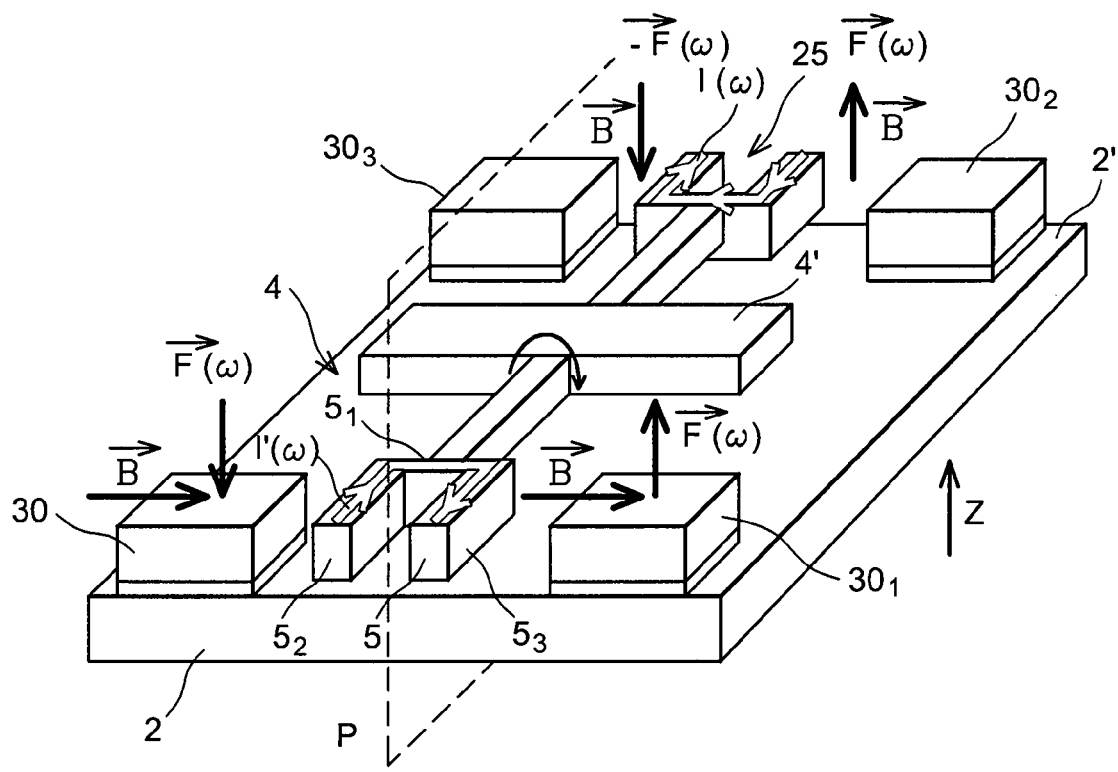
FIG. 6B
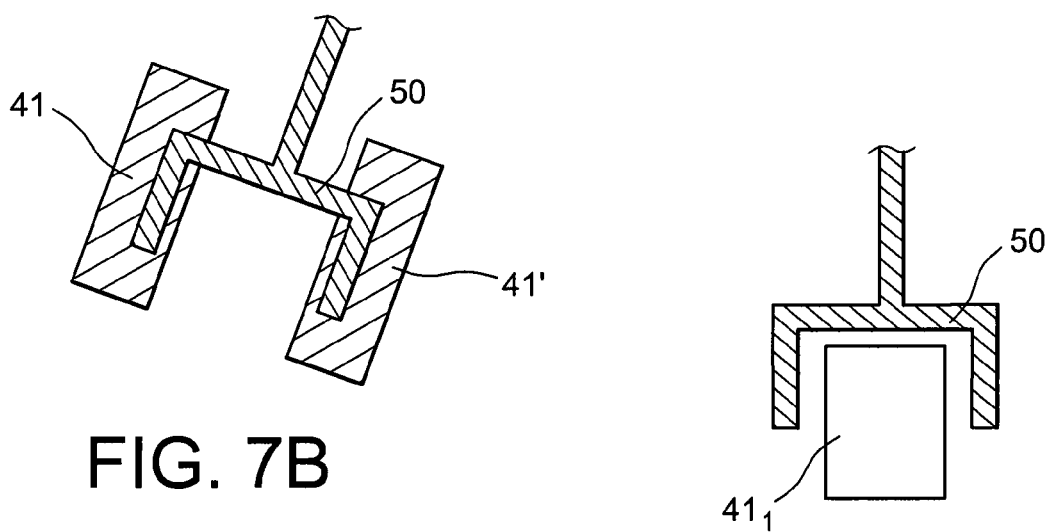
FIG. 7B
FIG. 7C

MAGNETIC NANO-RESONATOR

CROSS REFERENCE TO RELATED APPLICATIONS OR PRIORITY CLAIM

This application claims priority to French Patent Application No. 08 52062, filed Mar. 28, 2008.

DESCRIPTION

Field of the Invention and State of the Related Art

The invention relates to the field of electromechanical nano-resonators.

Nano-resonators pave the way for multiple applications. They have applications in the field of "environmental" sensors, of the biological or chemical or temperature type. They may also find applications in inertial sensors (accelerometers, gyrometers).

They may also be used in oscillators, as a time base or as filters.

An electromechanical resonator is a mechanical structure vibrated by an external excitation means (electrodes in the case of electrical excitation) and wherein the deformation (or displacement) is detected by another means (other electrode or other transduction principle).

The resonators may be classified according to the transduction and excitation means or according to the nature thereof (materials and geometric shape).

Electromechanical micro-resonators consist of vibrating mechanical structures, either in deformation (flexion of a beam) or in volume (beam or disk extension mode). The dimensions thereof range from a few dozen micrometers to several hundred micrometers.

Nano-resonators are small in size, the cross-sections thereof range from a few hundred nanometers by a few hundred nanometers to a few nanometers by a few nanometers.

A vibrating system is known which is described in the document by Rookes et al, Applied Physics Letters, 84, No. 22, 2004, which implements a beam oscillated under an intense external magnetic field (of the order of 6 Tesla) by running an alternating current in a metal layer deposited on the surface thereof.

At the same time, the beam serves as a support for a current loop which moves in a uniform magnetic field. A difference in potential appears at the terminals thereof and makes it possible to detect the movement of the beam. This current loop may be merged with the metal wire used for excitation.

This system makes it possible to obtain ground measurement results with extreme sensitivities. More generally, the electrical output signals have wide amplitudes and largely deviate from the background noise, which enables easy detection of the signal.

On the other hand, this system is clearly not suitable for integration and remains a laboratory measurement. Indeed, it is necessary to use supraconducting coils, in an ultrahigh vacuum (approximately $10^{-6}$-$10^{-7}$ Torr), and at low temperatures (a few Kelvin) to generate the uniform field required (from 6 to 10 Tesla).

This structure is also not compatible with the manufacture of processing electronics of the type positioned close to a NEMS (of the co-integration or post-CMOS integration type).

Therefore, the problem consists of finding a new electromagnetic resonator type device, of the nanometric type, which makes it possible to remedy the limitations of the devices currently known, and which is, in particular, suitable for integration, compatible preferentially with MOS type manufacture, and low in consumption.

More preferentially, such a device has low electrostatic coupling effects, and the lowest possible detection noise.

Preferentially, such a device is compatible with several geometries.

DESCRIPTION OF THE INVENTION

The invention relates to a resonator or nano-resonator device comprising:

at least one fixed element and at least one mobile element with respect to the fixed element, first electromagnetic means, integrated or fixed on the fixed element, and second electromagnetic means, integrated or fixed on the mobile element, said electromagnetic means interacting to actuate the mobile element or to generate an oscillating movement of the mobile element.

The invention also relates to a resonator or nano-resonator device comprising:

at least one fixed element and at least one mobile element with respect to the fixed element, first electromagnetic means, integrated or fixed on the fixed element, and second electromagnetic means, integrated or fixed on the mobile element, to generate, in interaction with the first electromagnetic means, an oscillating movement of the mobile element or to actuate the mobile element, at least one of the first and second electromagnetic means comprising plane shaped magnetic means, with magnetization in the plane thereof or perpendicular to the plane thereof.

The term "means integrated on the fixed element", or on the mobile element refers to means forming at least one part of said element and preferentially produced during the formation process of said element.

The term oscillating movement refers to any vibration movement, including at frequencies other than a resonance frequency.

A device according to the invention is fully suitable for integration, with the processing electronics thereof while minimizing consumption. In particular, the electromagnetic means are substantially the same size as the associated mechanical element (i.e. the fixed element or the mobile element).

Magnetic means, for example of planar shape have preferably a total thickness e which is small in comparison with at least one, or with each, of the two other dimensions (width and depth); for example e is less or equal than 10% of at least one, or of each, of the two other dimensions, each of the 3 dimensions being measured along perpendicular directions in the 3D space.

In addition, several geometric configurations may be implemented within the scope of the present invention.

According to one embodiment, the first electromagnetic means comprise at least one current conductor, arranged respectively on or in the mobile element or the fixed element, and the second electromagnetic means comprise magnetic means, arranged respectively on or in the fixed element or the mobile element, to generate magnetization according to a direction perpendicular to a current flow direction in said conductor.

The current conductor may be integrated or fixed on the mobile (or fixed) element, the magnetic means being integrated or fixed on the fixed (or mobile) element.

The current conductor may be in the form of a rectilinear conductor, or in the form of a current loop.

Means make it possible to circulate an alternating current in the current conductor, for example at least one frequency equal to, or close to, a resonance frequency of the mobile part.

The magnetic means may comprise at least one plane shaped magnet, with magnetization in the plane thereof. It consists for example of a magnet comprising a stack of thin layers, such as a layer of ferromagnetic material (F) and a layer of anti-ferromagnetic material (AF).

The AF layer blocks the magnetization of the F layer in a given direction. However, it is possible to reverse the direction of said magnetization. Indeed, if the temperature of the AF layer exceeds a limit value (blocking temperature), it "releases" the magnetization of the layer F, which may then be reversed under the application of a magnetic field. Means may therefore be provided to heat the layer of anti-ferromagnetic material (AF) above the blocking temperature of said layer. Said means may comprise a conductor of current which flows under or near the stack, and which may, if applicable, serve to generate the magnetic field applied to the ferromagnetic layer.

Other configurations of said magnetic means are possible.

For example, at least one of said first or second electromagnetic means comprises a stack of layers, such as an alternation of at least one magnetic layer (F) and at least one anti-ferromagnetic layer (AF). The stack is preferentially limited by two external layers wherein each is an anti-ferromagnetic layer.

At least one of said first or second electromechanical means may have reversible magnetization and be associated with magnetization reversal means.

The magnetic means may comprise at least one plane shaped magnet (for example produced in the form of thin layers), with magnetization perpendicular to the plane thereof, for example of the type comprising a plurality of CoPt layers. On the other hand, means are provided to reverse the magnetization of said perpendicular magnetization magnetic means. For example, it is possible to reverse the magnetization of this type of layer by associating it with an AF layer. To reverse the magnetization, the AF layer is heated to a temperature greater than the blocking temperature thereof and a magnetic field is applied so that the multi-layer adopts the desired magnetization (which will be maintained when the temperature of the AF layer returns under the blocking temperature thereof).

As a general rule, the maximum magnetic field generated by the magnetic means is less than 2.5 T or 1 T.

The movement of the mobile element may be a flexion movement or a torsion or rotation movement, or any volume deformation (in pure translation).

The possible geometries include the following:

two magnets may be arranged on or in the fixed part, on either side of a plane containing an axis of rotation of the mobile part; the latter may comprise a plate or a beam or planar element extending on either side of the axis of rotation; a current loop may be arranged on, or in, the mobile part.

one or two magnets may be arranged on or in the fixed part; in the case of two magnets, they may be deposited on either side of a plane containing a direction of displacement of the mobile part.

BRIEF DESCRIPTION OF THE DRAWINGS

FIGS. 6A and 6B are examples of embodiments of magnetic actuation oscillators with a mobile element in rotation.

FIGS. 7A to 7D relate to a magnetic actuation nano-oscillator with perpendicular magnetization magnets, and compression or expansion movement.

DETAILED DESCRIPTION OF SPECIFIC EMBODIMENTS

A device according to the invention comprises a fixed part and a mobile part with respect to the fixed part. The mobile part comprises a mechanical structure, for example, it consists of a plate or a beam, and will hereinafter be referred to using either of these terms. The gap, or distance, between the fixed part and mobile part (when the latter is idle) is less than 1 µm, for example of the order of 200 nm or 100 nm, or less than 200 nm or 100 nm, for example between 10 nm and 50 nm.

Said mobile part may have a flexibility which enables it to come partly in contact with the fixed part, under the action of the electromagnetic force torque, or which enables it to be bent by a certain amplitude as indicated by the arrow F in FIG. 3A, 3B, 4A-4C or 8B or 9A, 9C.

Figure 6A:
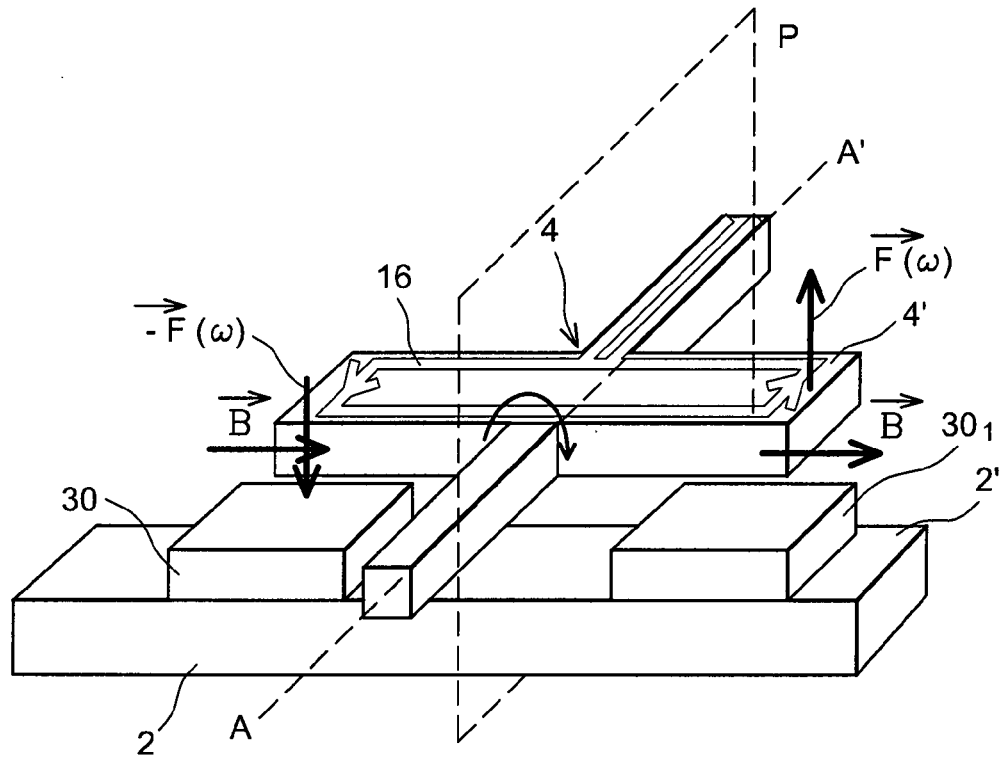
Figure 8A:
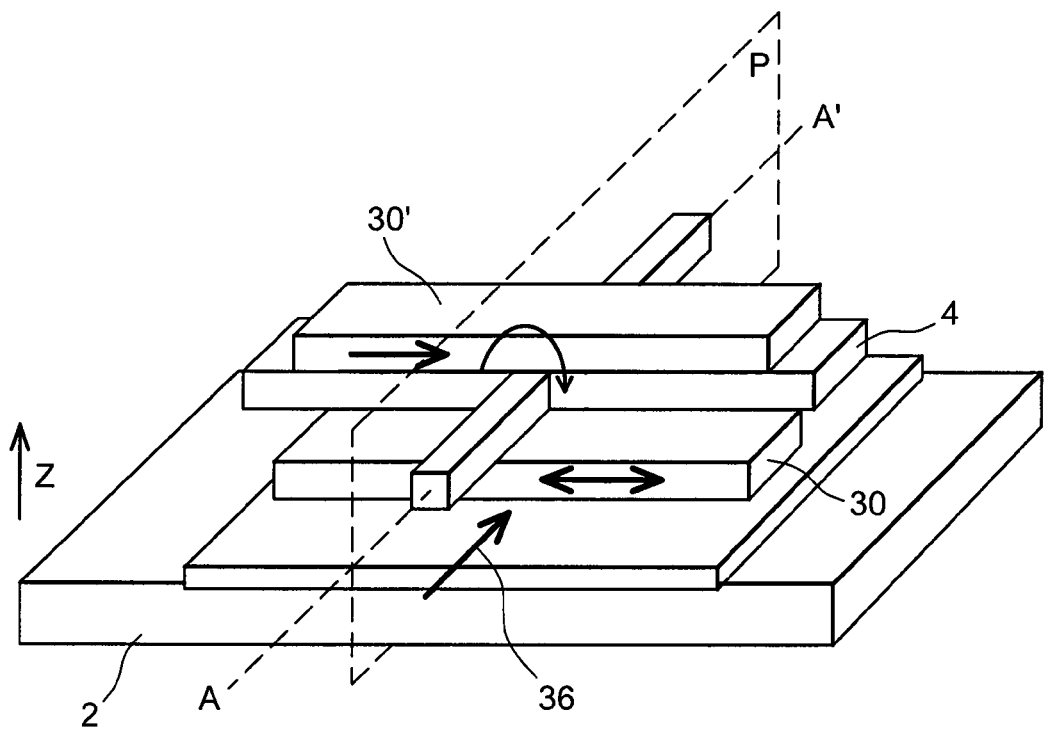
FIGS. 8A and 8B represent a magnetic actuation nano-oscillator with parallel magnets and pole reversal, and torsion or flexion movement outside the plane.

In other embodiments, it is rotated about an axis (case of FIG. 6A-6B or 8A).

A device according to the invention implements plane shaped magnetic means, or magnets, with residual magnetization, that is either irreversible or reversible, in the plane of the magnetic means or perpendicular to said plane. In the case of residual magnetization, the reversibility may be obtained by heating and applying an external magnetic field along the desired direction and the desired way.

Figure 1A:
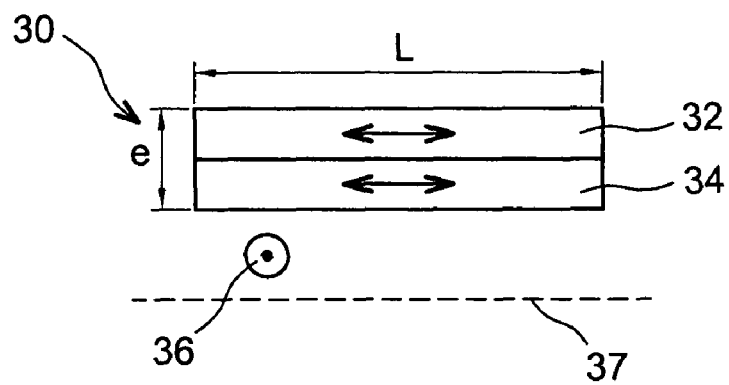
FIGS. 1A and 1B represent a magnet with magnetization parallel with the plane thereof, reversible or not.

An example of magnetic means 30, or nano-magnet, with plane reversible magnetization is represented in FIG. 1A and comprises a layer 32 of ferromagnetic material (F) and a layer 34 of anti-ferromagnetic material (AF). These two layers form a planar element, as the total thickness e thereof is small in comparison with at least one of the two other dimensions, and possibly with each of the two other dimensions; for example e is less or equal than 10% of at least one, or of each, of the two other dimensions. For example, said thickness e is between approximately 50 nm and 150 nm, for example equal to approximately 110 nm, for a width L (measured in the plane of FIG. 1A) of the order of magnitude of a few μm to several dozen micrometers, for example between 5 μm and 50 μm, for example of the order of 40 μm. The depth thereof (dimension perpendicular to the plane of the figure) is of the order of magnitude of a few μm to a few dozen micrometers, for example between 5 μm and 50 μm. The ratio L/e may therefore be at least 30 or 100.

The lateral dimensions may be smaller than those specified above. For example, the depth may be of the order of a few hundred nm, for example equal to approximately 200 nm. Advantageously, with a magnet located below the mechanical element, the dimensions of said magnet will be of the order of a few micrometers, which makes it possible to ensure satisfactory uniformity of the magnetic field.

A heating means is associated with this assembly, for example one or more current lines 36 arranged against the anti-ferromagnetic layer 34, or close to said layer. Advantageously, an intermediate layer of material, for example TiN or GeSbTe, capable of releasing heat under the action of an electrical current (thermistor) may be arranged between the line 36 and the layer 34. However, advantageously, the latter is as close as possible to the current line 36, so as to provide the most efficient heating possible. The line(s) 36 are preferentially rectilinear in order to generate the most homogeneous transverse magnetic field (in the plane of the layer 34) possible. Hereinafter, the description is limited to the case of a single current line, but the case of two lines is easily deduced.

The AF layer 34 blocks the magnetization of the layer 32 in one direction or another, in the plane of the element 30. The field generated by the assembly is also locally in the plane of the element 30.

However, if the temperature exceeds a limit value (the blocking temperature, determined by the anti-ferromagnetic layer 34, for example 150° C., but it may be greater, for example between 150° C. and 250° C.) the magnetization of the layer 32 may be reversed, while remaining in the plane of the element 30, under the application of a magnetic field. In other words, the overshoot of the blocking temperature of the layer 34 makes it possible to release the magnetization of the ferromagnetic layer. The magnetization is maintained in the new direction when the temperature of the AF layer returns under the blocking temperature thereof.

This blocking temperature may be reached and exceeded, by applying a current I in the current line 36. The heating produced in this way by means of the Joule effect will be transmitted to the layer 34. This current line 36 will also make it possible to induce a magnetic field, which will orient the magnetization of the ferromagnetic layer 32 and will make it possible to switch said magnetization.

Figure 1B:
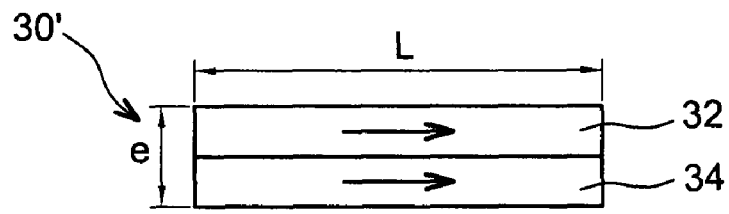

The stack of magnetic layers in the magnetic means, with plane reversible magnetization, may comprise more complex alternative embodiments, which make it possible to control the power supply of the F layer better. For example, a stack comprises, as illustrated in FIG. 1E, an F layer sandwiched between two AF layers. In another example, the structure in FIG. 1F may be produced: it comprises the following stack AF layer/F layer/AF layer/F layer/AF layer. Any number of layers, alternatively F and AF, may be provided. Preferentially, it is an odd number of layers, with an AF layer which limits the stack at each of the ends thereof, in other words, all the layers are comprised between two AF layers, as in FIGS. 1E and 1F.

Irrespective of the selected stack, there is no interpolated layer between the magnetic layers.

Figure 1C:
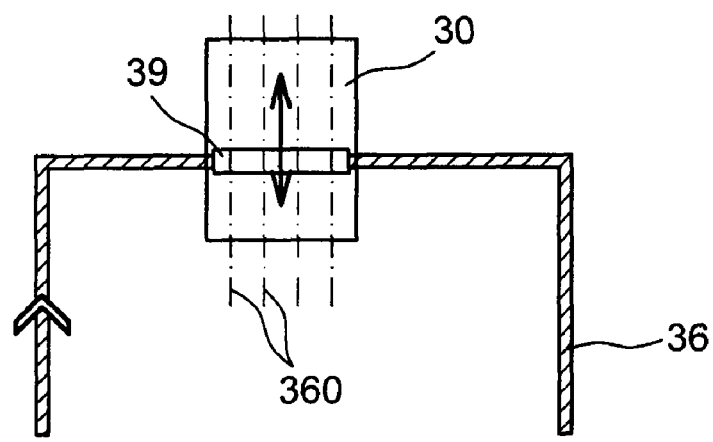
FIGS. 1C and 1D represent a magnet with magnetization parallel with the plane thereof, which is reversible, in a top view, with current lines making it possible to obtain reversibility.

FIG. 1C is a top view of the device in FIG. 1A, where the element 30 can be seen. A thermistor 39 is advantageously arranged under the element 30 and on the path of the current carried by the line 36 in order to increase the transfer of heat thereto.

Figure 1D:
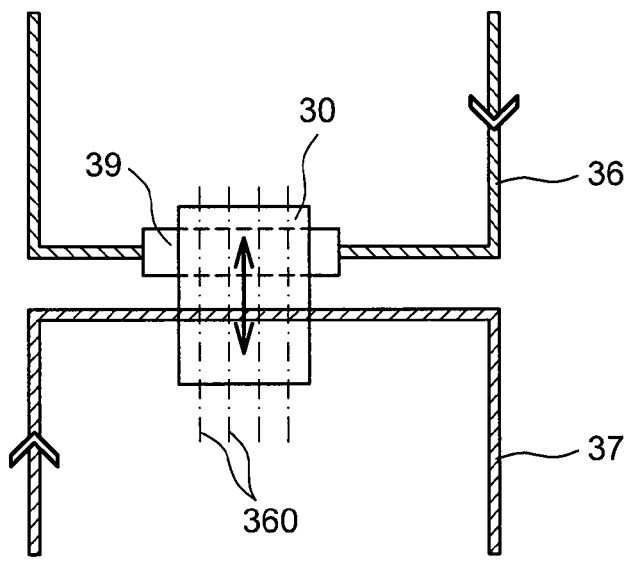
Figure 1E:
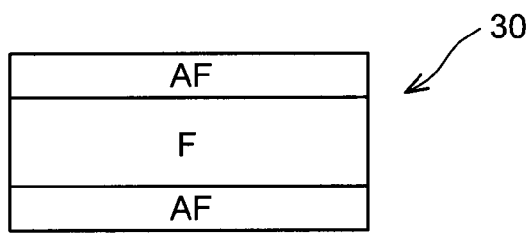
FIGS. 1E and 1F represent other stacks of magnetic means that can be implemented within the scope of the present invention.
Figure 1F:
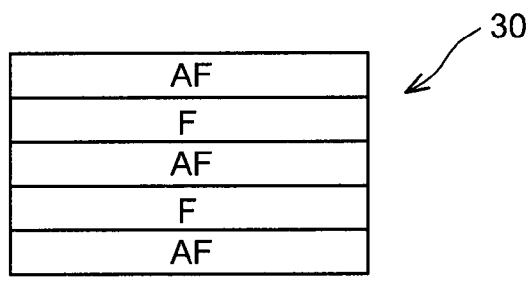

Instead of a single current line, it is possible to have 2 (or several) lines, one line 37 (represented by dotted lines in FIG. 1A) making it possible to increase the temperature above the switching temperature, and one line 36 to generate the magnetic field which will make it possible to orient and block the magnetization in the layer 32. This is also represented in FIG. 1D, which is also a top view of such a device, where it also possible to see the element 30 and a thermistor 39 arranged under the element 30 and on the path of the current carried by the line 36, in order to increase the transfer of heat thereto. However, a second current line 37 also passes under the element 30 and makes it possible to generate a magnetic field therein. The second line 37 is also represented in FIG. 1A, by dotted lines.

In both cases described above, the thermistor 39 may for example be made of TiN or TaN or GeSbTe.

In both FIGS. 1C and 1D, the lines of the field 360 generated by the current flowing in the line 36 (FIG. 1C) or in the line 37 (FIG. 1D) are also represented.

Therefore, it is possible to reverse the magnetization of the layer 32, and therefore the field generated by the element 30 in its own plane, by means of the conductors 36 and 37, applied against or in the vicinity of the element 30.

Once the magnetization of the layer 32 has been reversed, it generates a magnetic field in the plane of the element 30, in the direction opposite that previously generated.

Advantageously, a single conductor 36 is used to carry out the heating and magnetic field application function (case of FIG. 1A without the conductor 37).

In an advantageous embodiment, a thermistor (layer of TiN or GeSbTe) is positioned between the conductor 36 and the stack 30 so as to confine the heat in the vicinity of the layer 34.

It is possible to use:

as the anti-ferromagnetic AF layer material, PtMn or NiMn (high blocking temperature), which may be associated with CoFe, or NiFe as the ferromagnetic layer material;

or, as the anti-ferromagnetic layer material, IrMn or FeMn, which has a lower blocking temperature than PtMn, or NiMn, and which may be associated with NiFe or CoFe as the ferromagnetic layer material.

It is possible to use these (AF, F) material pairs: (PtMn, CoFe), (PtMn, NiFe), (NiMn, CoFe), (NiMn, NiFe) (for which Tb is high) and (IrMn, NiFe), (IrMn, CoFe) (for which Tb is lower), within the scope of the present invention. It is also possible to use (AF, F) pairs of the materials (FeMn, NiFe), (FeMn, CoFe).

To obtain strong magnetization, the material CoFe is used, which has a magnetization of 2.4 T (whereas NiFe has a magnetization of 1 T). Therefore, the following (AF, F) pairs are then preferentially used: (PtMn, CoFe), (NiMn, CoFe), (IrMn, CoFe), (FeMn, CoFe).

A production process of the layers 32, 34 is for example a cathodic or ionic sputtering process (PVD, IBD "ion beam deposition").

An alternative embodiment 30' of this element, without conductors 36, 37 (FIG. 1B), may also be implemented in some embodiments. The magnetization of the ferromagnetic layer 32 remains in this case fixed or blocked by the AF anti-ferromagnetic layer 34 in the plane of said element 30'. As an alternative embodiment, it is possible to have a stack with several F/AF layers, for example AF/F/AF/F/AF, as explained above and in the structures of the FIGS. 1E and 1F. The thicknesses of the F (ferromagnetic) layers are in this case dimensioned to prevent looping of the field from one F layer in another F layer.

Figure 2A:
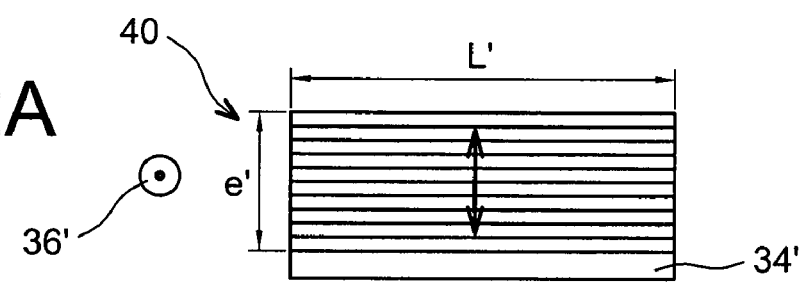
FIGS. 2A and 2B represent a magnet with magnetization perpendicular to the plane thereof, reversible or not.

An example of the means 40, or nanomagnets, with perpendicular magnetization, is represented in FIG. 2A. These means comprise a plane shaped magnet, produced in thin layers, with a field perpendicular to the plane thereof and, here again, at least one layer 34 of an anti-ferromagnetic material AF, for example IrMn or PtMn or NiMn. There may be two anti-ferromagnetic layers 34, 34', arranged on one side and/or on the other side of the stack 40 of thin layers.

It is possible to reverse the magnetization using conducting means 36' (FIG. 2C), if the element 40 is in contact with one or several anti-ferromagnetic layers, for example made of IrMn. For example, a coil surrounds the element 40 and is arranged in a substantially perpendicular plane to the direction of the field generated.

The reversal of the residual magnetization is performed by means of a thermal effect, as in the case of the components in FIG. 1A. It is possible to have two conductors, as in the case of FIG. 1D, one used to heat the anti-ferromagnetic layers, the other used to apply the magnetic field.

The conductor implemented for the heating may comprise, as explained above, a thermistor, for example made of TiN or TaN or GeSbTe.

Figure 2B:
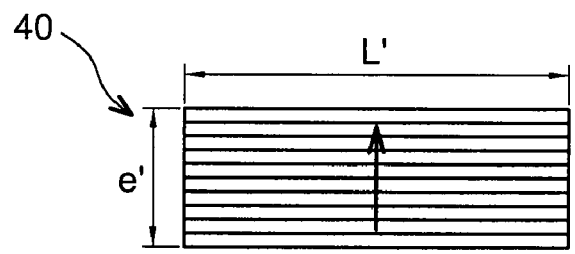

Another example of means 40' used to generate permanent residual magnetization perpendicular to the plane thereof is represented in FIG. 2B. Here again, these means comprise a stack of thin layers and they are plane in shape.

In the case of both FIGS. 2A and 2B, the thickness e' is considerably less than the two other dimensions, or in any case different by at least one order of magnitude, to said two other dimensions. Said magnet is of the CoPt multi-layer type or made of other materials. For the anti-ferromagnetic material AF of the layer 34' examples of materials have already been given above.

Figure 2C:
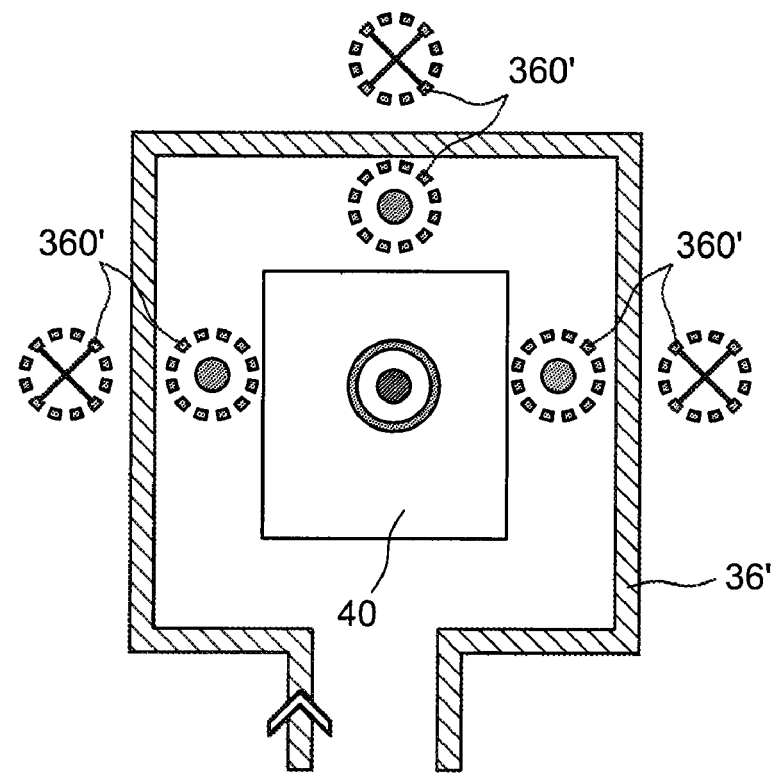
FIG. 2C represents a magnet with magnetization perpendicular to the plane thereof, which is reversible, in a top view.

FIG. 2C represents a top view of the device in FIG. 2A. The means 40, with perpendicular residual magnetization, are surrounded by a coil 36' which heats the AF layer and generates the magnetic magnetization reversal field 360'.

The choice of material will depend on its ability to generate perpendicular magnetization, also accounting for the thickness of the layers forming the stack 40. For example, residual magnetization on the surface of the stack 40 or 40', less than 1 T, of the order of a few tenths of a Tesla, for example 0.6 T, or greater than 0.3 or 0.5 T, is suitable for an application to a nano-oscillator according to the invention or to a nano-oscillator according to the invention.

For a further example, it is possible to cite, for the stack 40, 40' in FIGS. 2A-2B, a thickness e' between 10 nm and 20 nm, for example 15 nm (excluding anti-ferromagnetic layers 34, 34'), for a width L' of the order of a few hundred nanometers, for example between 100 nm and 500 nm, for example equal to 400 nm. The thickness e' specified means that each of the layers of the stack 40 may have in turn a thickness of the order of one nanometer, for example between 0.5 nm and 1.5 nm. The depth thereof may be equal to L', or of the order of magnitude of L'. An AF layer 34, 34' has a thickness substantially equal to a few nanometers, for example 10 nm, i.e. 20 nm for two AF layers 34, 34'.

The stack 40, 40' may be produced for example by means of cathode sputtering of cobalt and platinum layers in alternation; therefore, a pattern (Co/Pt)n is obtained, where n is the number of repetitions of the platinum/cobalt stack. The same procedure may be applied with other compositions.

These magnet structures make it possible to obtain sufficiently intense magnetic fields on a sub-micrometric scale for a mechanical actuation, and integrate the magnets in a nano-oscillator.

Therefore, the usable magnetic fields may be largely reduced with respect to the prior art (note the value of at least 6 Tesla for the prior art). In this case, the materials that can be integrated to produce said magnets generate fields less than 2.5 T, for example of the order of 1 to 2.4 Tesla, for AF/F multi-layers and less than 1 T, for example of the order of 0.6 Tesla, for perpendicular magnetization multi-layers.

Thin layer magnets exist in the literature, but the dimensions thereof remain of the order of several hundred micrometers and they lose their magnetic properties when reduced.

According to the nature of the oscillation movement required (flexion or torsion or translation, or expansion or contraction) and the direction thereof (in the plane or outside the plane), and according to the relative positions of the beam and the magnet, it will be possible to use the perpendicular magnet and/or the parallel magnet.

In order to improve the basic architectures if required, a composition of parallel magnets (with variable and/or fixed magnetizations) and/or perpendicular magnets may be produced (particularly to carry out differential measurements improving the continuous signal/background ratio when the oscillator is used as a sensor).

In the examples hereinafter, identical references refer to identical or similar elements.

Figure 3A:
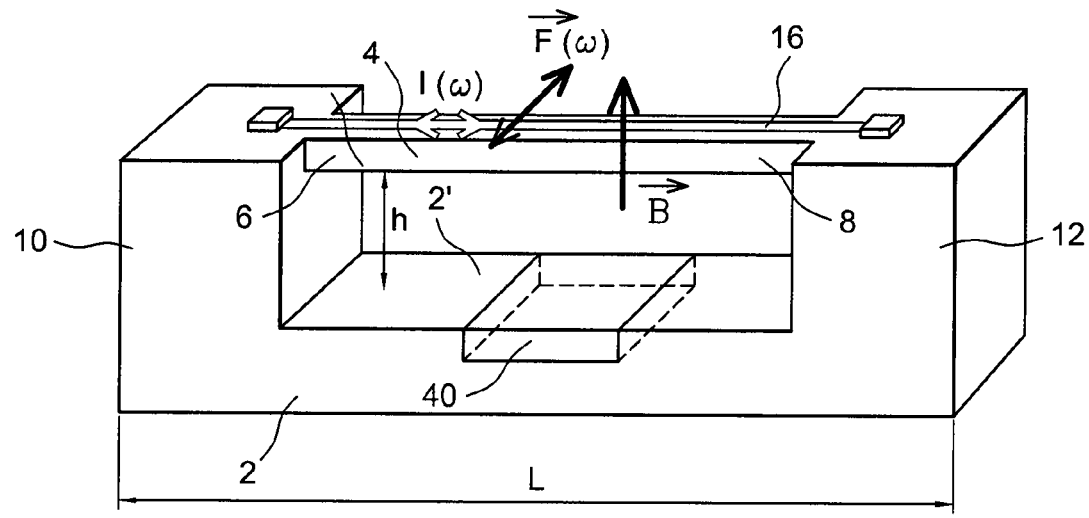
FIGS. 3A and 3B are examples of embodiments of a magnetic actuation nano-oscillator with a magnetization perpendicular to the plane thereof, with movement in the plane, in flexion, and with extension movement in the plane, in volume, respectively.

An example of a nano-resonator system according to the invention is illustrated in FIG. 3A.

In this example, a nano-resonator comprises a mobile part, for example a beam, referenced 4 in FIG. 3A. Said mobile part is in the idle position thereof in the figure. It is fixed, by both ends 6, 8 thereof, to lateral parts 10, 12 of a fixed base 2. Magnetic means 40 forming a nano-magnet, making it possible to generate a magnetization B perpendicular to the surface 2' of the base 2, are arranged in or on said base 2. The mobile part, in this example, is made of a conducting material, or a conductor 16 is formed or deposited on or in said mobile part.

The gap h between the mechanical element in the idle state and the magnet is of the order of, or less than, 1 μm or 200 nm or even 100 nm. For example, it is between 10 nm and 50 nm.

When the mobile part 4 is activated, by the combined action of the magnetic means 40 and an alternating current I flowing in the conductor 16 associated with the mobile part 4, said mobile part is resonated (as a function of the frequency ω of the current I). A flexion movement then takes place in the plane of the plate. The system in FIG. 3A makes it possible to produce a flexion movement of the mobile part 4, parallel with the substrate 2 (oscillating along the direction of the arrow F).

Figure 3B:
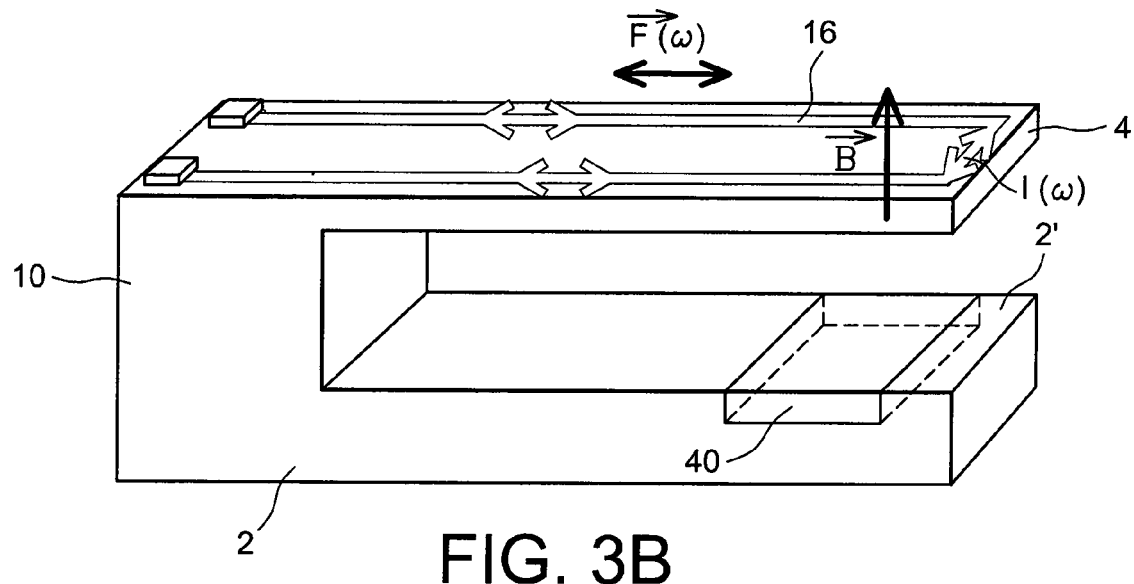

FIG. 3B is an alternative embodiment, wherein the mobile part is fixed at only one of the ends thereof to a base 10 attached to a substrate 2. Here again, a conductor 16 makes it possible to circulate an alternating current which will interact with the perpendicular magnetic field (to the surface 2') generated by the means 40. In this figure, the conductor is in the form of a current loop, in a plane of the mobile part 4 substantially parallel with the upper plane 2' of the substrate 2. The interaction of the magnetic field and an alternating current having a frequency ω moving in said loop will result in the application of an oscillating force F, as specified in FIG. 3B. Said force is contained in the plane of the mobile part 4. This results in a movement, alternatively extension and compression, in volume, of the part 4, along the direction of said force F.

The embodiments in FIGS. 3A and 3B have magnetic actuation with a magnet 40 with perpendicular magnetization (as in FIGS. 2A and 2B).

It is possible to implement a magnetic actuation with a magnet with parallel magnetization (as in FIGS. 1A and 1B). In this way, in the embodiment in FIG. 4A, with the mobile part fixed on both sides thereof, a flexion movement is made outside the plane of the mobile part 4 (or in a plane perpendicular to the surface 2' of the fixed part 2). The field B generated by the magnetic means 30, with parallel magnetization, is, in this case, contained in the plane of the substrate 2 (or parallel with the surface 2' of said substrate). It interacts with the (alternating) current I flowing in the line 16. The resulting force F(ω) is perpendicular to the plane of the substrate 2, and therefore the beam 4 also vibrates along this direction.

Figure 4A:
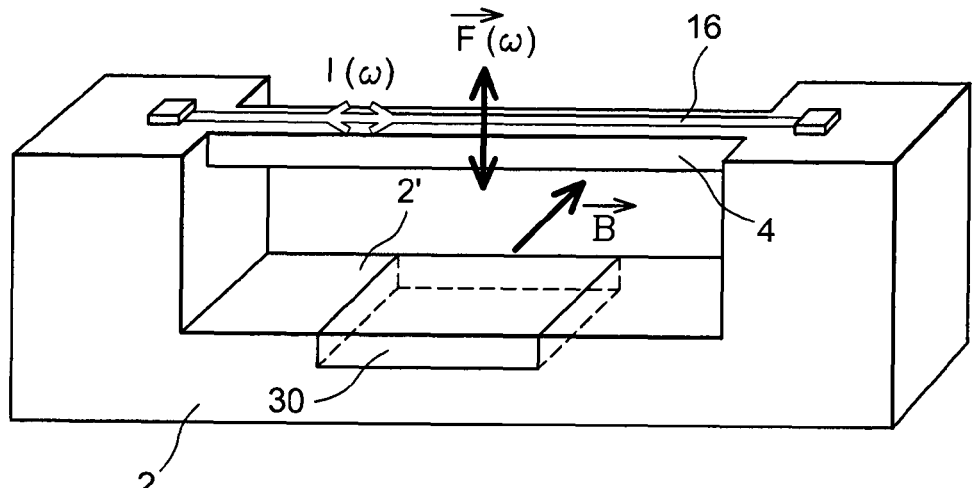
FIGS. 4A and 4B are examples of embodiments of a magnetic actuation nano-resonator with magnetization parallel with the plane thereof.
Figure 4B:
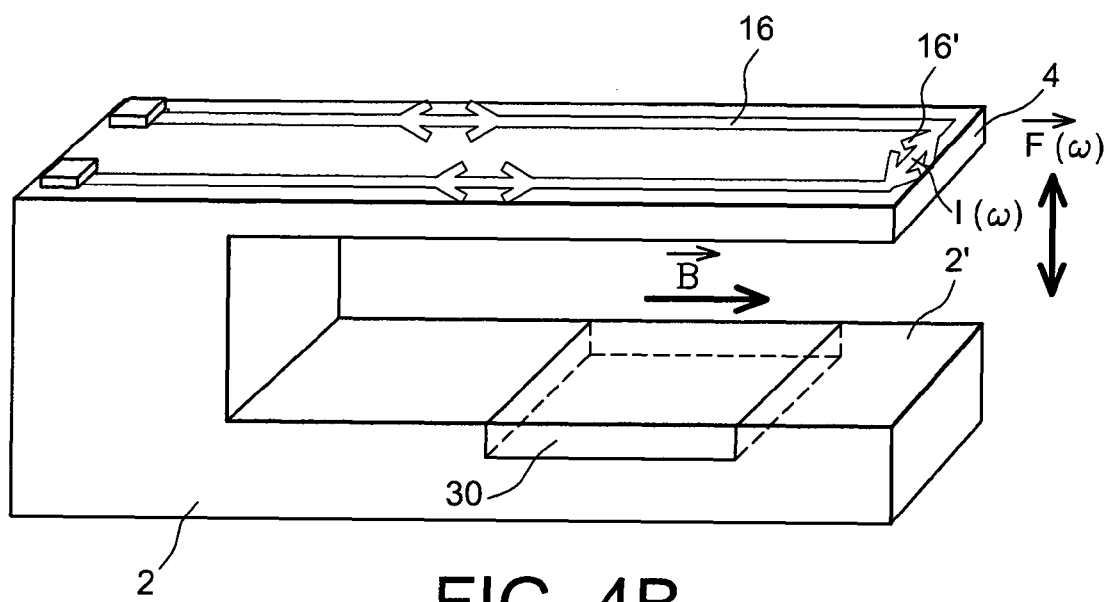

In the embodiment in FIG. 4B, with the mobile part fixed to only one of the two ends thereof, a flexion movement is made outside the plane of the mobile part 4. The field generated by the magnetic means 30 is, in this case, parallel with the plane of the substrate 2. The conductor arranged on the mobile part has the shape of a current loop. The magnetic field interacts with an alternating current I(ω) flowing in said loop. In the embodiment illustrated, it is in fact the current flowing in the part 16' (the bottom of the "U", or the part of the current loop closest to the free end of the beam 4) which interacts with B, directed along the direction of elongation of the plate 4. The resulting force F(ω) is perpendicular to the plane of the substrate 2, and therefore the beam 4 also vibrates along this direction.

In all these embodiments, the oscillation of the mobile part is obtained using an alternating current (sinusoidal or square) in the conducting means 16, preferentially at a resonance frequency of the beam (where different modes may be excited if required).

It is possible to obtain, by selecting the magnet (parallel or perpendicular magnetization, reversible or not), and the positioning of the magnetization thereof with respect to the conductor or the current loop of the mobile part, all the movements, outside the plane defined by the position, in the idle state, of the mobile element, and/or in said plane.

In addition, it is possible to generate extension forces liable to vibrate the structure in volume in order to attain higher vibration frequencies, which may be implemented in "time base" type applications (therefore, frequencies of the order of 1 GHz or more can be attained).

In the examples described above, or in those described hereinafter, the conductor 16 or the current loop may be:

metallic (Pt, Al, Cu, Au, AlSi, etc.) deposited on the beam (or more generally on the mechanical structure). According to the target applications, it may have a thickness varying from a few dozen nanometers to several hundred nanometers, for example between 10 nm and 500 nm. These metallic layers are low in resistivity, which makes it possible to minimize the impact of the Johnson noise.

or result from a silicidation process (they are made for example from NiSi, or PtSi, or TiSi$_2$, or WSi$_2$, etc.), or consisting of the beam 4 itself, particularly if said beam is doped: the doping may then take place before the manufacturing process, for example during initial epitaxy of doped Si on the small plate; it may also take place during the manufacturing process, by implantation through adjustable thicknesses according to the dose and energy of the dopants.

In the example described above, or in those described hereinafter, the mobile mechanical element 4 may be:

produced directly in a metallic layer (in a material such as Ru, or AlSi, etc.), or structured in silicon or any other compound (poly Si, or SiN, etc.). The silicon may be non-doped or partially doped or doped throughout the thickness thereof according to the selected configurations.

In the above embodiments, the current conducting means 16 are arranged on, or integrated in, the mobile part and the magnetic means, on or in the fixed part. However, for each of the configurations shown, the reverse configuration is possible: the magnetic means 30, 40 may be arranged on or in the part 4 which is mechanically mobile, whereas the current conducting means 16 are arranged in or on the fixed part 2. The force resulting from the magnetic field-current interaction will apply so as to cause one of the displacements, already described above, of the mobile part with respect to the fixed part.

Figure 4C:
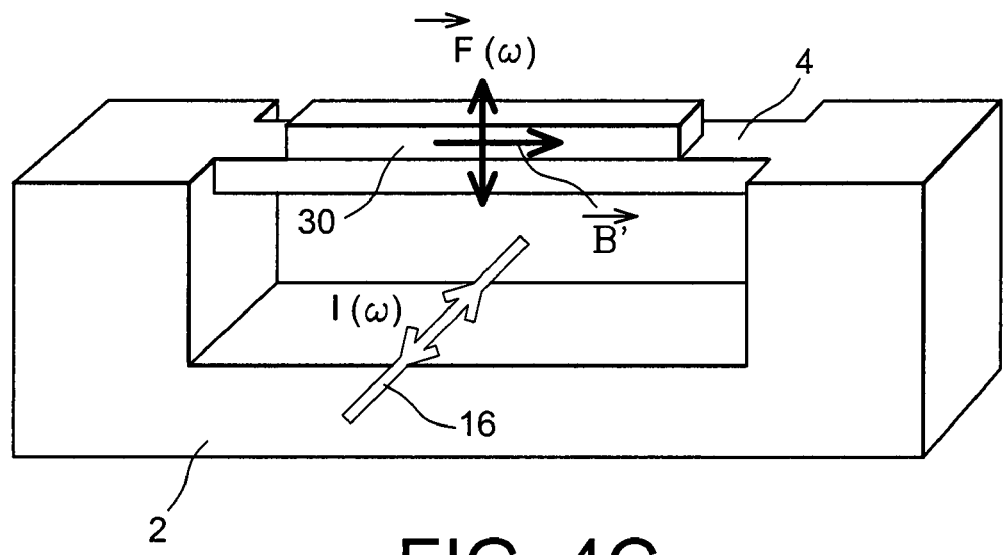
FIG. 4C is an example of an embodiment of a magnetic actuation nano-oscillator, with a magnet fixed on the mobile part.

So, FIG. 4C illustrates a structure which, mechanically of the type of that in FIG. 4A, but wherein the position of the magnetic means 30 and conducting means 16 is reversed. This structure has a mobile part fixed on both sides thereof. A flexion movement is made outside the plane of the mobile part 4 (or in a plane perpendicular to the surface 2' of the fixed part 2). The field B generated by the magnetic means 30 (arranged on or in the mobile part 4), with parallel magnetization, is, here again, parallel with the surface 2' of the substrate 2. It interacts with the (alternating) current I flowing in the line 16, arranged on or in the fixed part 2. The resulting force F(ω) is perpendicular to the plane of the substrate 2, and therefore the beam 4 also vibrates along this direction.

In the embodiments and the alternative embodiments thereof described above, the current conducting means and the magnetic means are located in two different planes, parallel with the surface 2' of the fixed part 2.

Other architectures enable an embodiment, in the same plane, or substantially in the same plane, of the elements forming the conducting means 16 and the magnetic means 30, 40.

It is thus possible to obtain flexion movements or torsion movements.

Figure 5A:
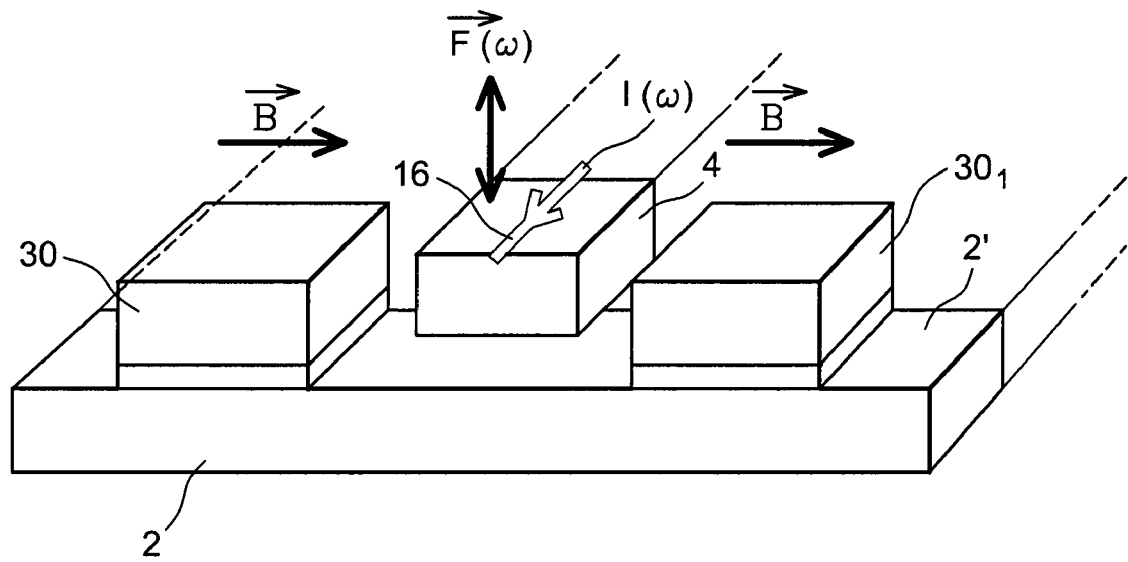
FIGS. 5A and 5B are examples of embodiments of magnetic actuation nano-oscillators with a conductor and a mobile element arranged partially between two magnets and with a flexion movement outside the plane.
Figure 5B:
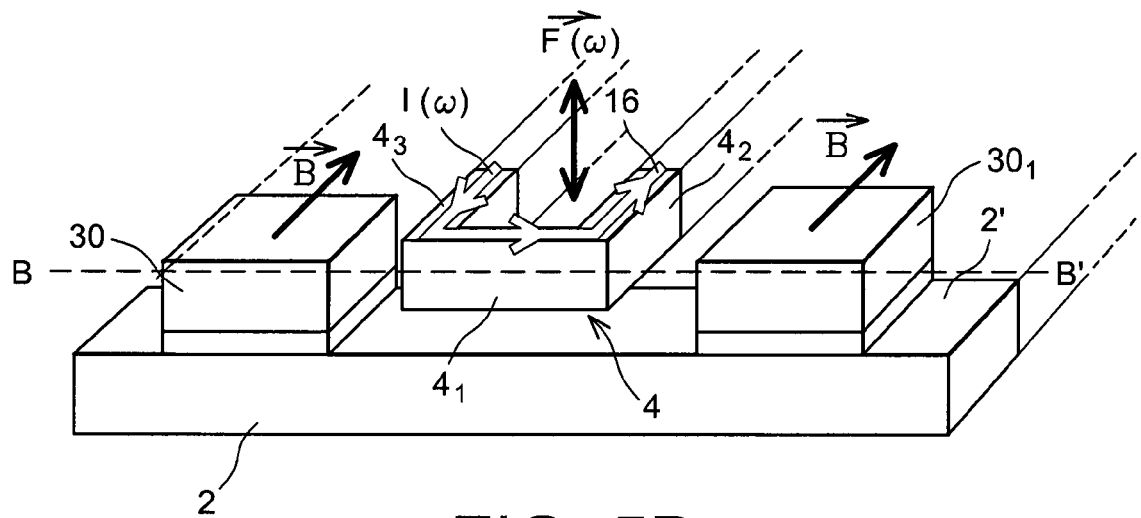

Two examples of this type of device, with flexion movement, are illustrated in FIGS. 5A and 5B.

In these examples, magnetic means 30, 30$_1$, with parallel magnetization, are arranged on either side of the mobile part 4 (in this case, a beam), which may have a linear shape (FIG. 5A) or a "U" shape (FIG. 5B).

The current conducting means 16, arranged on or in the mobile part, have, in the interaction zone with the magnetic means, the corresponding shape, linear or U-shaped.

In the second case (FIG. 5B), the current return part (the base of the "U") is located as close as possible to the magnetic means, substantially between the magnets 30, 30$_1$. Specifically, the U-shaped part 4 comprises a first section 41, arranged parallel with an axis BB' which connects the two magnets, and two lateral sections 42, 43 wherein each is connected to an end of the first section 41. The whole, consisting of the various sections of the "U" and the magnets 30, 30$_1$ is located substantially in the same plane, parallel with the surface 2' of the substrate 2.

For these two structures, the movement is a flexion movement, perpendicular to the plane defined by the surface 2' of the fixed part 2.

The field generated by the magnetic means 30, 30, is substantially contained in the plane of the substrate 2 and it interacts with the current flowing in the line or loop 16. In fact, it interacts with the portion of the conductor 16 with respect to which it is directed in a substantially perpendicular manner. The resulting force $F(\omega)$ is perpendicular to the plane of the substrate 2, and therefore the beam 4 or, more generally, the mobile element 4, also vibrates along this direction.

In an alternative embodiment, in both cases, only the magnetic means 30 are arranged on or in the fixed part. In other words, the means $30_1$ are optional and the removal thereof nevertheless makes it possible to obtain flexion movement outside the plane. The displacement (flexion) of the mobile part 4 also takes place outside the plane. When two magnets are arranged on either side of the mobile element, they have the same magnetization direction.

An at least partially symmetric situation may be obtained with the conductor 16 arranged on or in the fixed part and the magnet on or in the beam or the mobile part.

In the case of the structures in FIGS. 5A and 5B, and in the other examples of embodiments, the amplitude of the movement of the beam may be controlled (by a closed loop and integrated electronics, for example).

In another embodiment, the mobile part is mobile about an axis of rotation. Two examples of this type of movement are illustrated in FIGS. 6A and 6B. It consists of a nano-oscillator with magnetic actuation with parallel magnets.

The case of FIG. 6A makes it possible to produce a torsion movement outside the plane of a plate about an axis formed by two single beams, and the magnets are positioned under the plate.

In this first example the magnets 30, $30_1$, each with parallel magnetization, and wherein the magnetizations are directed in the same direction, are produced on, or in, the fixed substrate 2, on either side of a plane P perpendicular to the plane of the surface 2' of the fixed substrate 2. Said plane P contains an axis AA' of rotation of the mobile part 4, also parallel with the plane of the surface 2'. The mobile part also comprises a planar element 4', which extends on either side of the axis of rotation AA', and whereon a current loop 16 is located. In the idle state, said planar element 4 is arranged substantially parallel with the surface 2'.

Each of the lateral parts of the planar element 4', on either side of the axis AA', extends over one of the magnets 30, $30_1$. The portion of the current loop 16 flowing on or in said part will therefore interact with the magnetic field of the magnet over which it is located. According to the direction of the current in the loop, the interaction with the magnetic field B will make it possible to apply to the planar element 4' a rotation (plate in rotation) or a torsion (of the arm) about the axis AA', in one direction or another.

In other words, the mobile element is subject to a couple of electromagnetic forces $[F(\omega), -F(\omega)]$, induced by the magnets 30, 30, (see FIG. 6A). In fact, the magnetic field interacts essentially, at the ends of the plate, with the portion of the current loop with respect to which it is substantially perpendicular.

In a second example (see FIG. 6B), magnets 30, $30_1$, $30_2$, $30_3$ are formed or positioned on or in the fixed substrate 2, on either side of a plane P perpendicular to the plane 2' of the fixed substrate and comprising an axis AA' of rotation of the mobile part, arranged substantially parallel with the plane 2'. The magnets have a parallel magnetization with the surface 2' of the substrate 2. The two magnets 30, 30, located at one end of the device generate a magnetic field which has an orientation opposite that of the field generated by the two magnets located at the other end of the device. Other configurations are possible, as a function of the relative orientations of I and B.

As in FIG. 6A, the mobile part 4 also comprises a planar element 4', which extends on either side of the axis of rotation AA'. Said axis is prolonged, at each of the ends thereof, by a portion 5, 25 in the shape of a "U" which comprises a current loop, also in the shape of a "U". More specifically, the portion 5, for example, comprises a first section 51, arranged perpendicularly to the axis AA', and two lateral sections 52, 53 wherein each is connected to one end of the first section 51. The portion 25 may have the same structure.

Each of the U-shaped ends is arranged substantially parallel with the plane of the surface 2' and between the magnets associated with said end. It should be noted that, at each end, it is possible to raise the magnets to provide a field which is perpendicular with the current line. For each end portion, the portion of current loop flowing therein will therefore interact with the magnetic field of the magnets between which it is located. In fact, the field interacts essentially with the portion of the conductor with respect to which it is directed in a substantially perpendicular manner. According to the direction of the current in the end portion, the interaction with the local magnetic field, generated by the two magnets between which said end portion is located, will make it possible to subject the planar element to rotation or torsion about the axis AA', in one direction or another.

In view of the direction of the magnetic fields, parallel with the plane 2' of the substrate 2, the forces $F(\omega), -F(\omega)$ resulting from the current-field interaction are therefore perpendicular to the plane 2' of said substrate 2.

In this configuration of FIG. 6B, a torsion movement is produced outside the plane, with a plate, about an axis formed by two beams connected to the substrate by a U-shaped mechanical element (in fact, by the free arms of the "U"). The magnets are substantially in the same plane as the plate in rotation.

In other configurations, the forces resulting from this interaction may be directed in, or parallel with, the plane 2' of the fixed substrate 2.

Figure 7A:
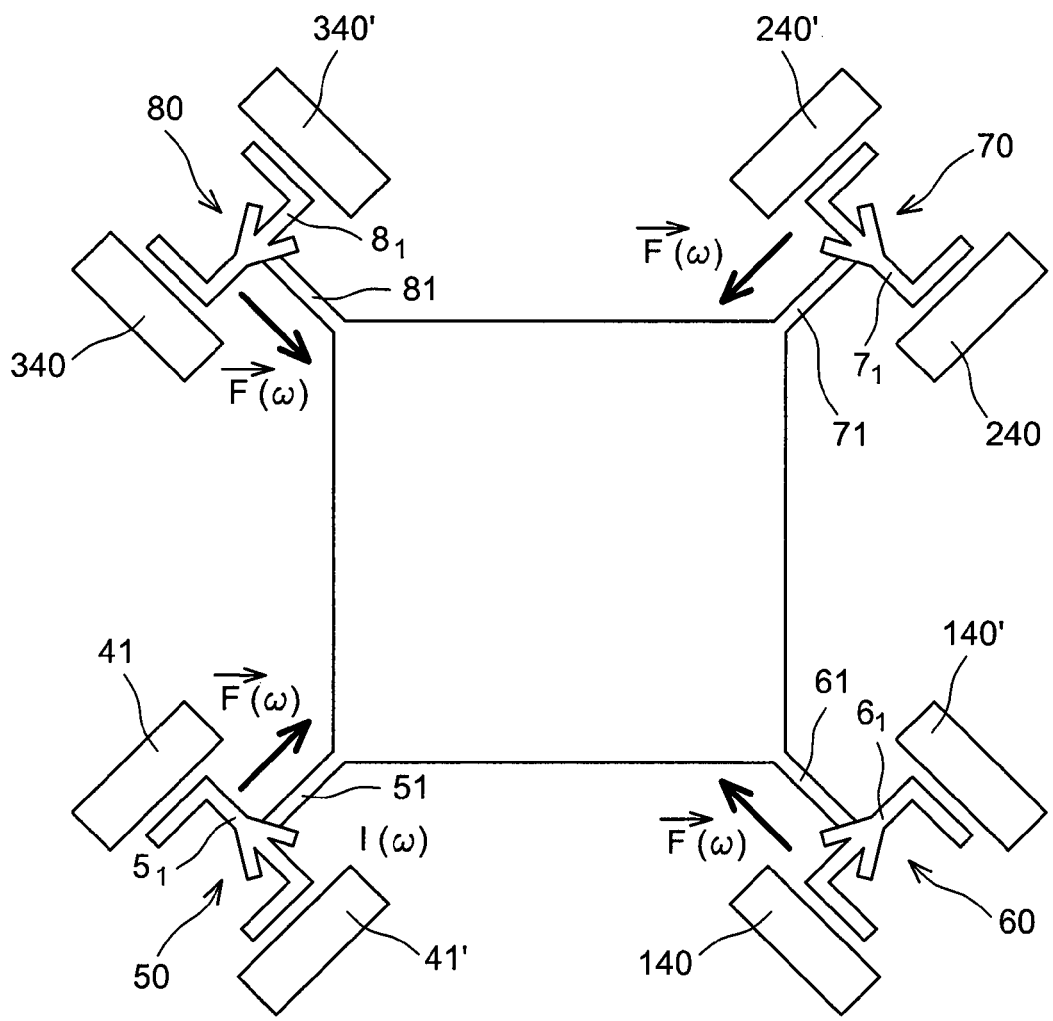

This is the case of the structure in FIG. 7A, which comprises n (n>1) current loops 50, 60, 70, 80, wherein each is arranged between two magnets 41, 41', 140, 140', 240, 240', 340, 340' each with magnetization perpendicular to the plane of the substrate 2 containing same. In fact, each loop has the shape of a corresponding mechanical element, and is arranged substantially parallel with the plane 2' of the substrate 2, at one end of a beam 51, 61, 71, 81 which will be subjected to a force along the axis thereof. This force will therefore be applied to any element located in the extension of the beam. In FIG. 7A, said element 41 is planar, substantially square or rectangular (but it may have any other shape, for example that of a disk), and will be subject to the forces from the n (in this case: n=4, but n may be greater than 1 in general) axes which lead to each corner of the planar element. Therefore, it is possible to apply n compression forces or n compression/traction forces. This results, for the mobile element 41, in a compression or expansion effect.

Figure 7D:
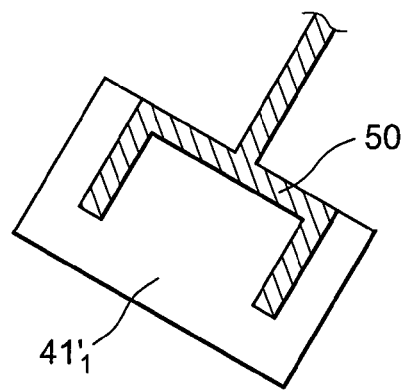

At each loop, the magnetic field interacts with the current flowing in the portion 51, 61, 71, 81 of the loop which is substantially perpendicular to the beam 51, 61, 71, 81 whereto it is connected. The perpendicular magnetization magnetic means may be positioned as indicated in FIGS. 7A and 7B, i.e. one magnetic element under each end arm of each U-shaped element, and therefore under the current lines (FIG. 7B for the single portion 50 and the magnetic means 41, 41' thereof). As a further alternative embodiment, it is possible to have the arrangement indicated in FIG. 7C or 7D, i.e. with a single perpendicular magnetization magnet arranged in the plane of the substrate 2, but:

either between the projections, on the plane 2' of the substrate 2, of the end arms of each U-shaped element (FIG. 7C), or under all the projection, on the plane 2' of the substrate 2, of each U-shaped element (FIG. 7D).

Both cases result in the same type of interaction and the same effect as that described above with reference to FIG. 7A (production of a force parallel with the plane of the substrate).

This structure in FIGS. 7A-7D makes it possible to produce a movement of compression or expansion of the volume of a plate, with n forces (n>1) directed in the plane of said plate.

For all the structures proposed, care is taken to place the magnets positioned side by side at a sufficient distance to prevent the usable dipolar magnetic fields from closing on the nearest magnet.

According to another embodiment of the invention, a magnet 30 with reversible magnetization and a magnet 30' wherein the magnetization is fixed are used.

Figure 8B:
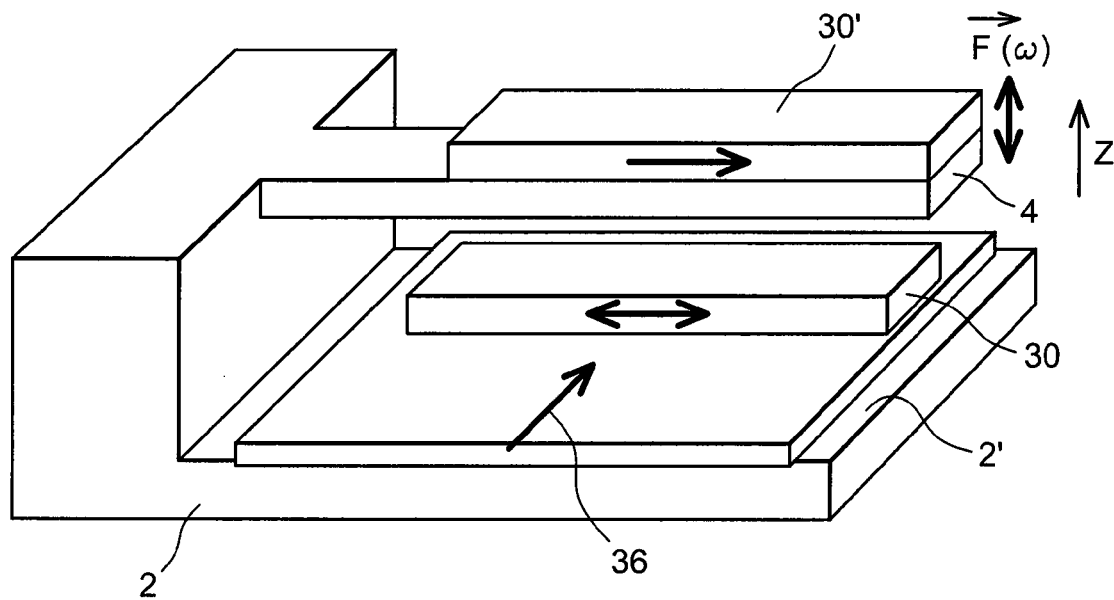

FIGS. 8A and 8B describe the envisaged architectures with "parallel" magnets to induce movements outside the plane of the small plate.

FIG. 8A gives an example of torsion plate movement outside the plane of a small plate 4 rotated about an axis AA' formed by two single beams.

FIG. 8B gives an example of flexion movement of a beam or an anchored plate 4, free at one of the ends thereof, outside the plane of said beam or said plate.

In this way, in FIG. 8A, two magnets are implemented, both with parallel magnetization.

One (30) of these magnets has reversible magnetization and is positioned on, or in, the fixed substrate 2, under the mobile part 4.

Therefore, conductor means 36 pass in the substrate 2, in the vicinity of said magnet 30 with reversible magnetization, in order to trigger the heating and the reversal of the magnetization.

This first magnet, with reversible magnetization, is mechanically attached to the fixed support whereas the second magnet (fixed magnetization) is mobile, attached to the part 4, which is moved with respect to the fixed magnet.

A torsion movement, about the axis AA', ("outside plane" type movement) may firstly be obtained. To this end, the magnets are arranged, during production, parallel with each other, to subsequently induce the movements outside the plane of the small plate (which contains the variable magnetization magnet).

More specifically, the "fixed" (in mechanical terms) magnet 30 extends on either side of a plane P, perpendicular to the plane of the fixed substrate 2, and comprising an axis of rotation AA' of the mobile part. Said axis is in turn parallel with the plane defined by the surface 2' of the substrate 2. The mobile part also comprises a planar element 4, which extends on either side of the axis of rotation, and whereon, or wherein the other magnet 30', with fixed magnetization, is located. Each of the parts of the planar element extends over a part of the fixed magnet, with reversible magnetization (along a direction Z perpendicular to the surface 2' of the substrate 2). The field resulting from the mobile magnet 30' with fixed magnetization will therefore interact with the magnetic field of the fixed magnet 30, with reversible magnetization, above which it is located. According to the direction of the magnetization thereof, it will be possible to subject the planar element 4 to a rotation about the axis of the plate or a torsion of the axis about the axis AA', in one direction or another. In other words, the mobile element is subjected to a couple of electromagnetic forces induced by the magnets 30, 30' (see FIG. 8A). The interaction is of the following type: mutually repelled N pole/N pole or mutually attracted N pole/S pole.

It is then possible to perform mechanical resonance of the mobile magnet by periodically reversing, at the target resonance frequency, the poles of the mechanically fixed magnet 30. Therefore, the current flowing in the conductor means 36 makes it possible to control the oscillation frequency of the torsion element 4.

In the embodiment in FIG. 8B, a flexion movement outside the plane of the mobile part 4 is produced.

Here again, a reversible magnetization magnet 30 is implemented, using the means 36, positioned on or in the fixed substrate 2. A magnet 30' is positioned on, or in, the mobile part 4. Said part is in the form of a beam, and it is located, along the axis Z perpendicular to the surface 2' of the substrate 2, opposite the reversible magnetization magnet 30. During production, it is arranged substantially parallel with the surface 2' of the substrate 2. The beam may be embedded on one side and free on the other ("cantilever" embodiment), or embedded on both sides ("bridge" embodiment).

Here again, the magnetic fields generated by the two magnets 30, 30' are, during the production of the mobile part 4, both parallel with the plane of the substrate 2.

The magnet 30' arranged on the mobile part 4 has a fixed magnetization. The two magnetic fields interact and the resulting force F (attraction or repulsion according to the direction of the variable magnetization) is perpendicular to the plane of the substrate 2. Therefore, the beam 4 also vibrates in this direction, at the frequency set by the current in the conductor 36.

In these configurations, the mobile magnet (or the surface whereon it is bound) may therefore be either deformable in flexion (FIG. 8B), or rigid, but rotating about an axis (FIG. 8A).

In each of FIGS. 8A and 8B, a single current line has been drawn. Nevertheless, as also specified above with reference to FIG. 1A, it is possible to dissociate the current line serving to induce a field in the "reversible" magnet and the heating current line.

Movements in the plane of a small plate containing a variable magnetization magnet may also be generated.

Figure 9A:
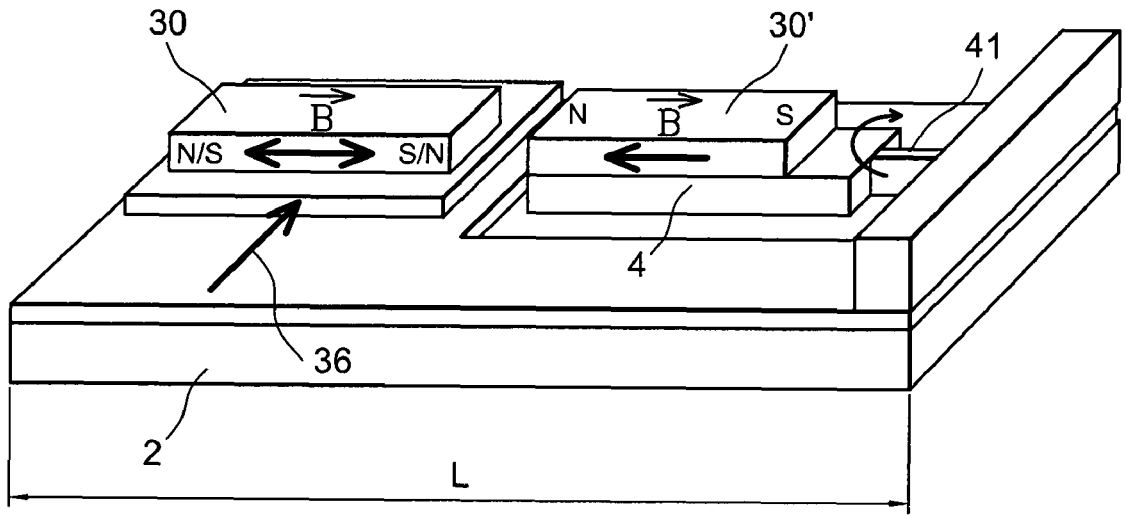
FIGS. 9A and 9B represent a magnetic actuation nano-oscillator with parallel magnets and pole reversal, and pivoting movement in the plane of a plate linked with a flexible hinge.
Figure 9B:
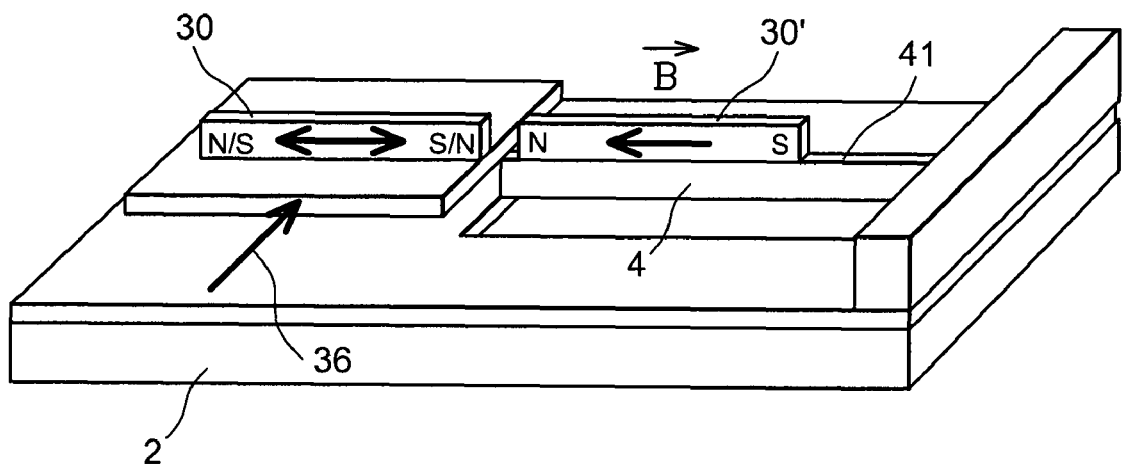

The corresponding architectures are illustrated in FIGS. 9A and 9B.

In this way, in FIG. 9A, a pole of the fixed magnet 30 (with reversible magnetization) is arranged opposite a pole of the magnet 30' (with fixed magnetization) bound with the mobile part (a planar element). Said part is connected to the substrate, by a hinge or a pivot 41, about which it will be able to pivot in the plane of the fixed substrate 2 or parallel with said plane. The field resulting from the mobile magnet 30' with fixed magnetization will therefore interact with the magnetic field of the fixed magnet 30, with reversible magnetization, opposite which it is located.

According to the direction of the magnetization thereof, it will be possible to subject the planar element to pivoting about the hinge or the pivot 41, in one direction or another, but always parallel with the surface 2' of the substrate 2.

In other words, the mobile element 4 is subject to a couple of electromagnetic forces induced by the magnets 30, 30' (see FIG. 9A), resulting from the pivoting described above.

FIG. 9B correspond to the case of a mobile element in the form of a beam supporting the fixed magnetization magnet. Here again, this results in a flexion movement, about the end 41 of the fixed beam with respect to the substrate 2, in one direction or another, but always parallel with the surface 2' of the substrate 2.

In the case of this figure, a flexion movement is produced in the plane of a beam, the magnets being in the same plane as the plate.

In the case of FIGS. 9A and 9B, the movement in the plane or parallel with the plane of the substrate 2 is favored by mechanical means, for example by a very slight mechanical stiffness in said plane of the means 41 with respect to the stiffness outside said plane and/or by a misalignment of the magnets (on either side of the hinge axis).

The structures in FIGS. 8A-9B make it possible to produce a magnetic actuation nano-oscillator, with parallel magnetization magnets and with reversal of the magnetic poles of one of the magnets.

Examples of production processes of a device according to the invention will now be given.

In a first example, the magnet is produced in the fixed substrate 2. This first example results in the production of a device which operates according to the first actuation mode described above.

Figure 10A:
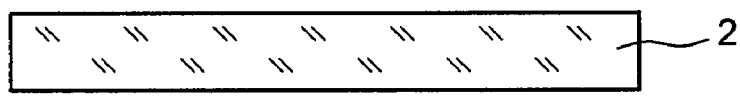
FIGS. 10A-10K, 11A-11L, 12A-12J represent steps of various methods to produce a device according to the invention.
Figure 10B:
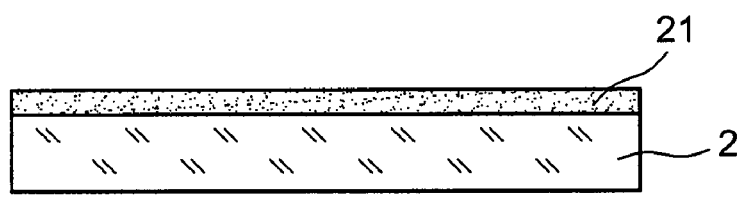
Figure 10C:
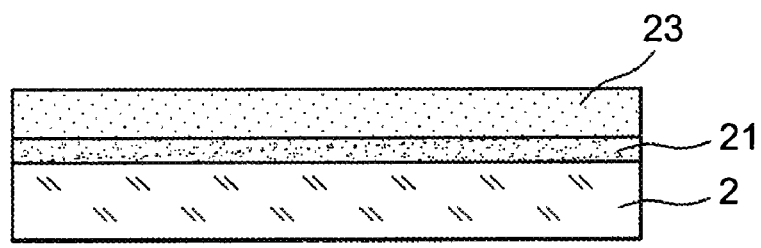

On a silicon substrate 2 (FIG. 10A), a 40 nm thick deposition 21 of SiN (FIG. 10B) is performed, followed by a deposition 23 of oxide (FIG. 1C), for example 100 nm thick.

Figure 10D:
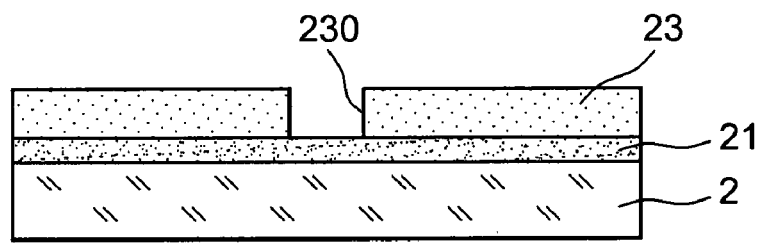

A lithography step is performed, followed by dry etching of the oxide layer, stopping on the SiN layer. In this way, an etched zone 230 wherein the magnet 30 (FIG. 10D) will be formed is produced.

Figure 10E:
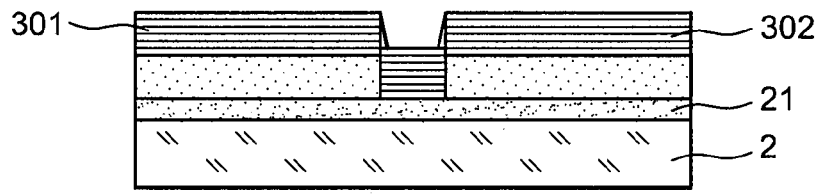

Said magnet is then produced by means of multi-layer deposition, and then annealed (FIG. 10E).

Figure 10F:
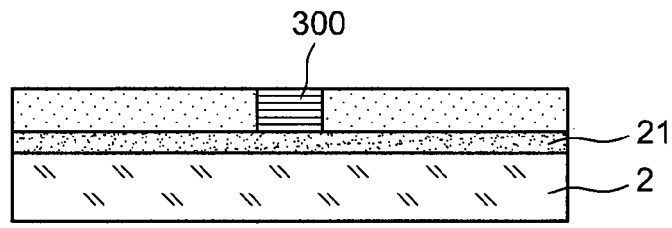

Mechanical-chemical polishing, stopping on the oxide layer 23, makes it possible to eliminate the lateral portions 301,302 of magnetic layer depositions (on the non-etched zones of the layer 23) so as only to leave the portion forming the magnet 30 remaining in the cavity 230 (FIG. 10F). As an alternative embodiment:

magnetic layers are produced, flat, and etched in the desired magnet shape, this structure is then coated with a layer which is then planarized.

Figure 10G:
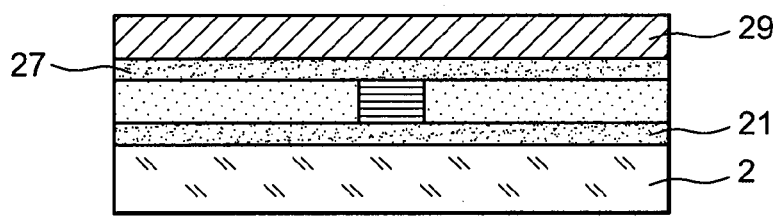

On this structure, at a low temperature, deposition 27 of silicon nitride and deposition 29 of a sacrificial layer, for example oxide, approximately 50 nm thick (FIG. 10G) are performed. In an alternative embodiment, it is possible to perform deposition of SiO2 oxide, followed by deposition of Ti (sacrificial layer) with the release of said layer by XeF2 plasma. The thickness of the sacrificial layer will determine the gap between the mobile part and the fixed part.

Figure 10H:
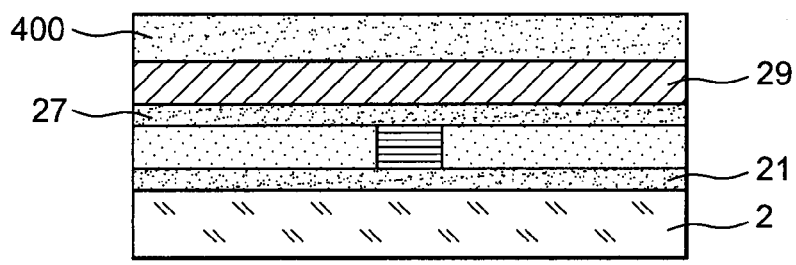

A layer 400, for example of silicon nitride, is then deposited, wherein the mobile beam may be formed (FIG. 10H). This layer is substantially 100 nm thick.

Figure 10I:
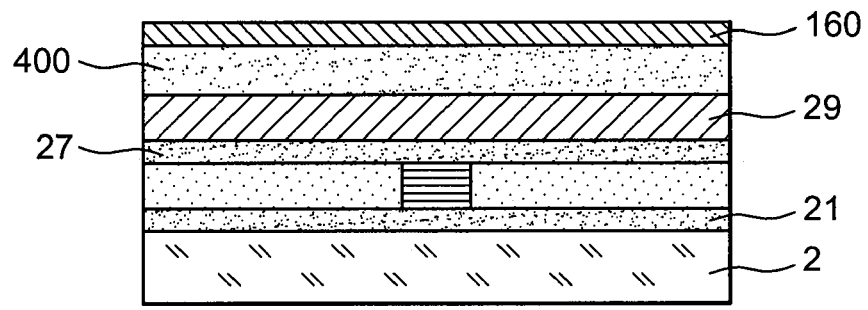
Figure 10J:
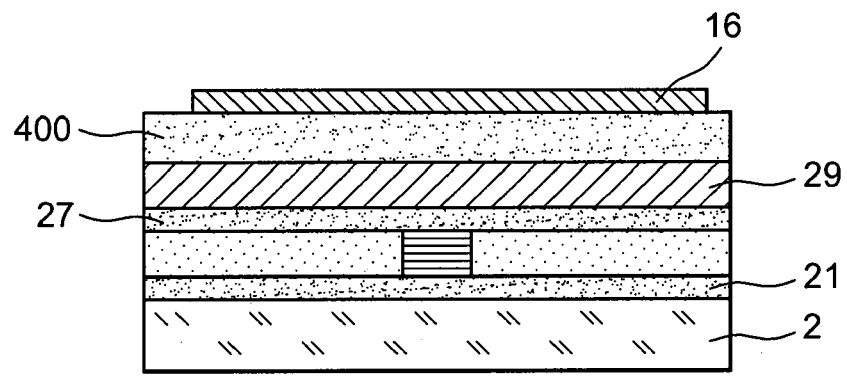

A metallic layer 160, for example a layer of AlSi approximately 100 nm thick, is then deposited (FIG. 10I), wherein the current lines 16 (FIG. 10J) are produced by means of lithography and etching.

A lithography and etching step makes it possible to structure the mechanical element of the layer 400.

Figure 10K:
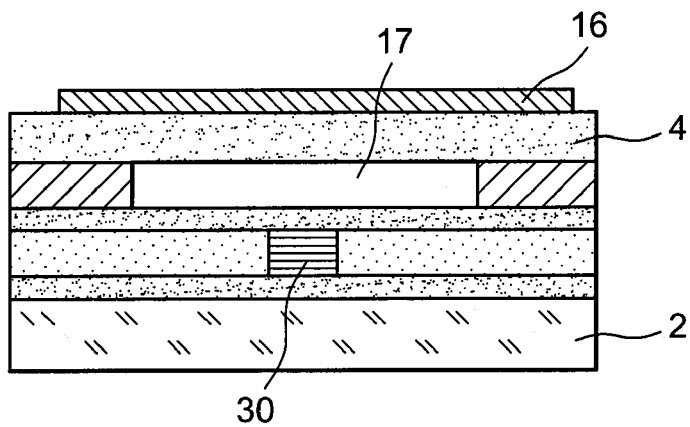

Using an HF vapor, the sacrificial layer under the beam is removed. The space or gap 17 between the mobile part and the fixed part is therefore released (FIG. 10K).

The process may also be accompanied by doping step to obtain good ohmic contacts under the current line connection studs.

The processes are carried out at low temperatures (<250° C.) from the deposition of the magnetic layers.

Protective layers of the magnet may also be produced, to protect same during the release step. In addition, it is possible to produce an adhesion layer before any evaporation of the first anti-ferromagnetic layer.

It is possible to use other materials for the sacrificial layer, dielectrics, beam and current loop metal. The process described above may be adapted according to the nature of said materials.

In a second example, the magnet is produced on the mobile element.

Figure 11A:
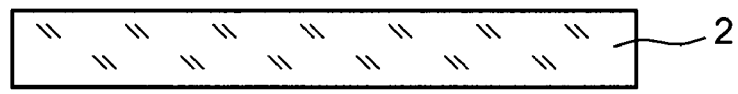
Figure 11B:
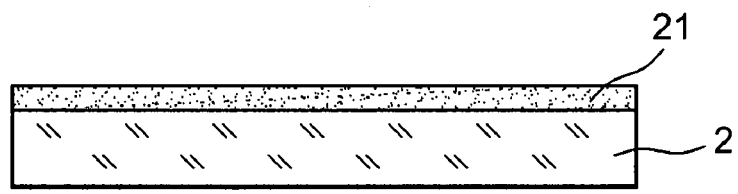
Figure 11C:
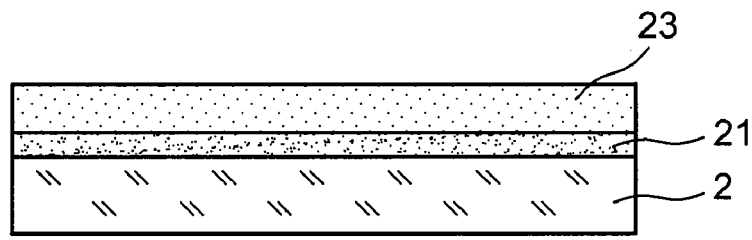

On a silicon substrate (FIG. 11A), a 40 nm thick deposition 21 of SiN (FIG. 11B) is performed, followed by a deposition 23 of oxide (FIG. 11C), for example 100 nm thick.

Figure 11D:
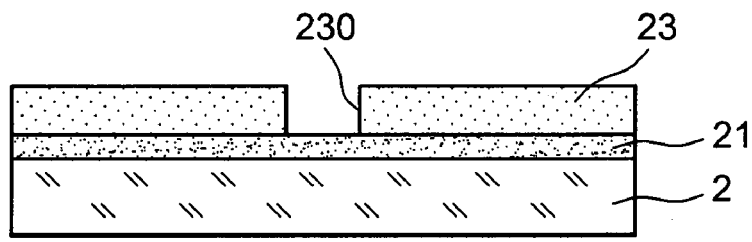
Figure 11E:
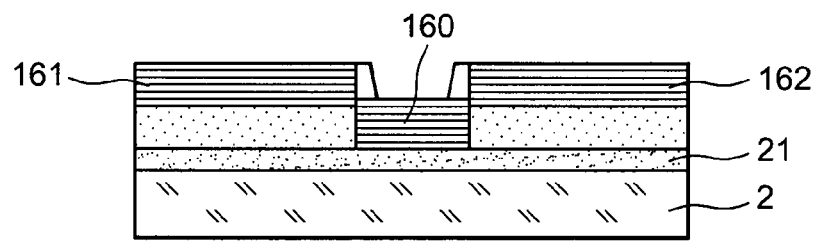

A lithography step is performed, followed by dry etching of the oxide layer 23, stopping on the SiN layer 21. In this way, an etched zone 230 (FIG. 11D), wherein the current line(s) 16 will be formed is produced, by means of deposition of metal or conductor 160, for example a deposition of 1 μm of TiN (FIG. 11E). In an alternative embodiment, it is possible to perform electrolysis.

Figure 11F:
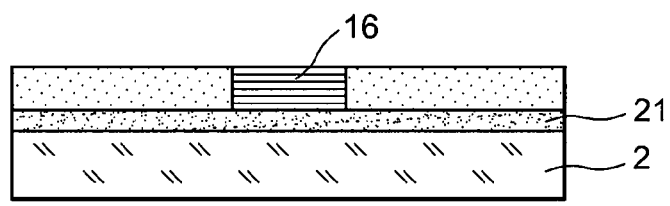

Mechanical-chemical polishing, stopping on the oxide layer, makes it possible to eliminate the lateral portions 161, 162 of depositions of metal or conductors (on the non-etched zones of the layer 23) so as only to leave the portion forming the conductor 16 in the cavity 230 (FIG. 11F).

Figure 11G:
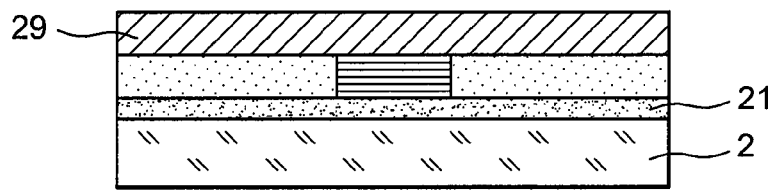

On this structure, deposition of a sacrificial layer 29, for example made of titanium, approximately 50 nm thick (FIG. 11G) is performed. The thickness of the sacrificial layer will determine the gap between the mobile part and the fixed part.

Figure 11H:
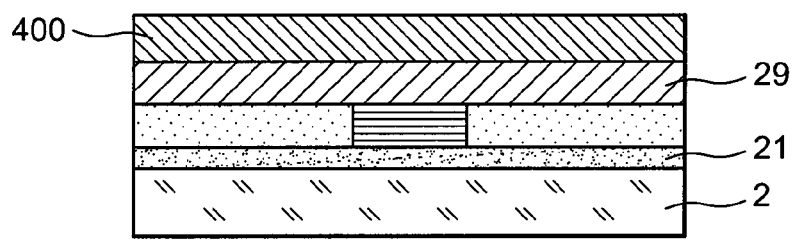

A layer 400, for example a metallic layer, an example whereof is ruthenium (Ru), is then deposited, wherein the mobile beam 4 may be formed (FIG. 11H). This layer is substantially 50 nm thick.

Figure 11I:
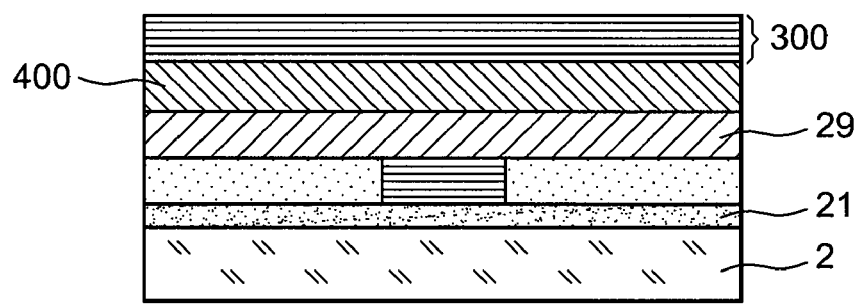
Figure 11J:
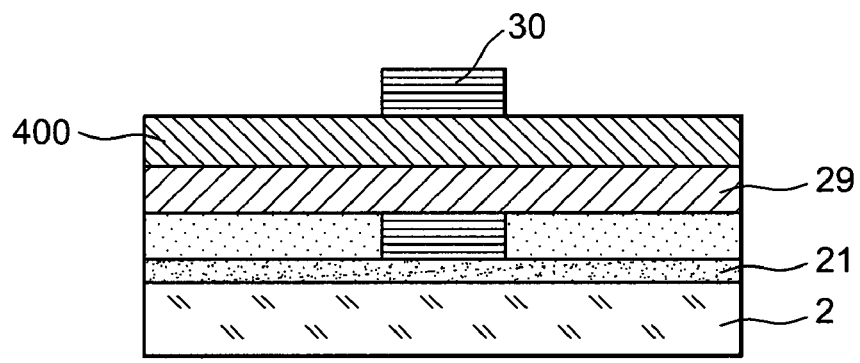

Magnetic material layers 300 are then deposited (FIG. 11I), wherein the magnet 30 (FIG. 11J) is produced by means of lithography and ion beam etching.

Figure 11K:
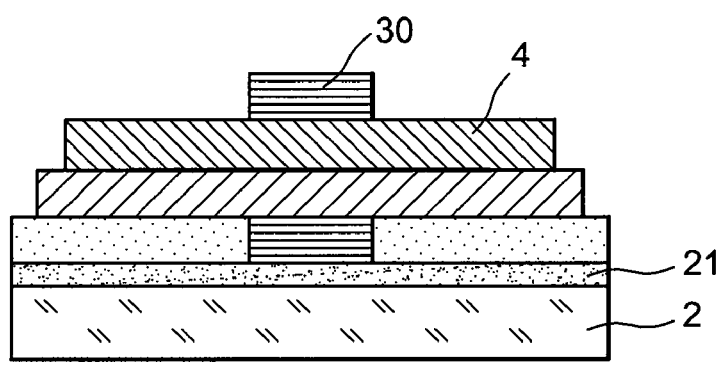

The beam 4 may then be lithographed and etched in the layer 400 (FIG. 11K).

Figure 11L:
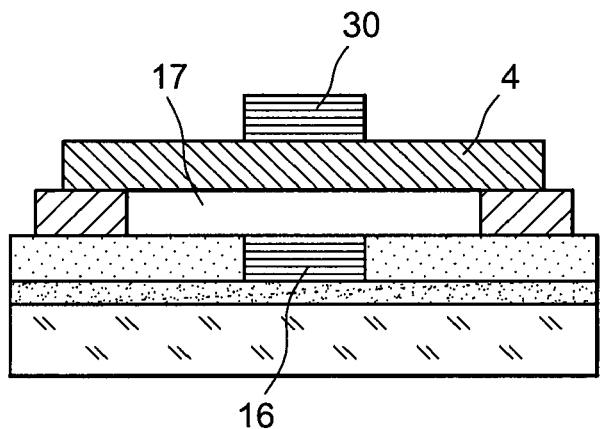

By means of plasma etching, the sacrificial layer 29 is removed under the beam. The space or gap 17 between the mobile part 4 and the fixed part 2 is therefore released (FIG. 11L).

The remarks made with reference to the previous example also apply here.

In a third example, an architecture with alternating reversal of the magnet poles is produced. The current lines are produced before the magnetic layer deposition.

The first steps make it possible to obtain an identical structure to that in FIGS. 11A-11E. However, the conductor obtained is that, 36, which will make it possible to heat the magnetic structure 30 and obtain the reversal of the field.

Figure 12A:
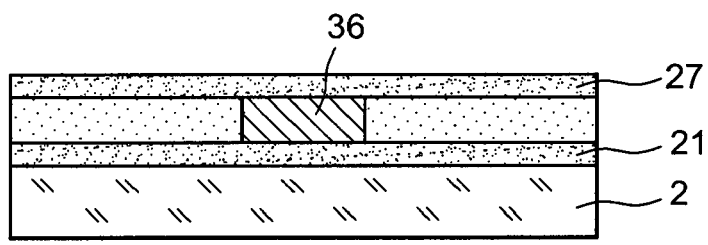

Therefore, the FIG. 12A corresponds substantially to the structure obtained after FIG. 11F, and whereon an etch stop layer is added, for example a silicon nitride (SiN) layer 27 approximately 40 nm thick.

Figure 12B:
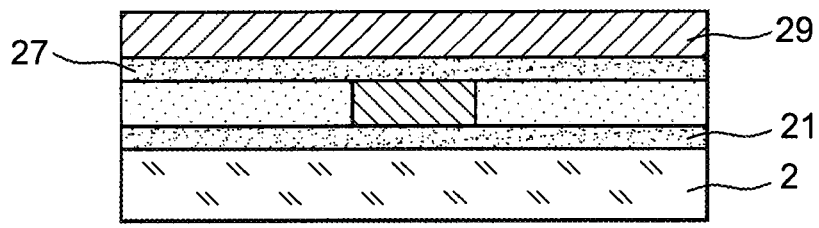

Then (FIG. 12B), an oxide layer 29, for example 100 nm thick, is deposited on the stop layer.

Figure 12C:
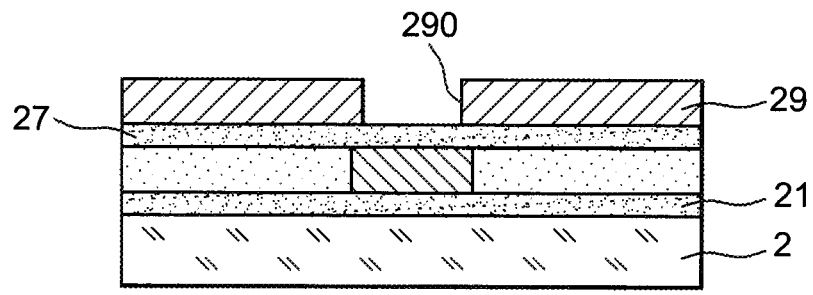

A lithography step is performed, followed by dry etching of the oxide layer 29, stopping on the SiN layer. In this way, an etched zone 290 wherein the magnet will be formed (FIG. 12C) is produced.

Figure 12D:
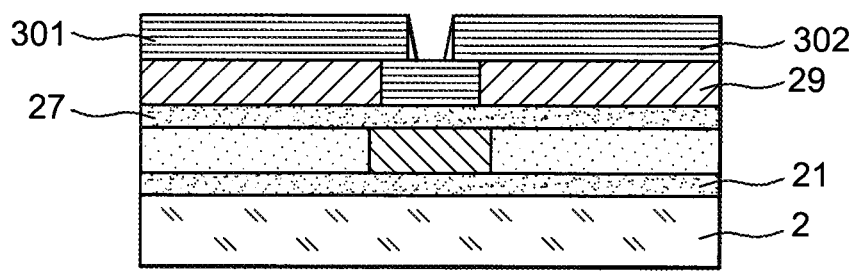

Said magnet is then produced by means of multi-layer deposition, and then annealed (FIG. 12D).

Figure 12E:
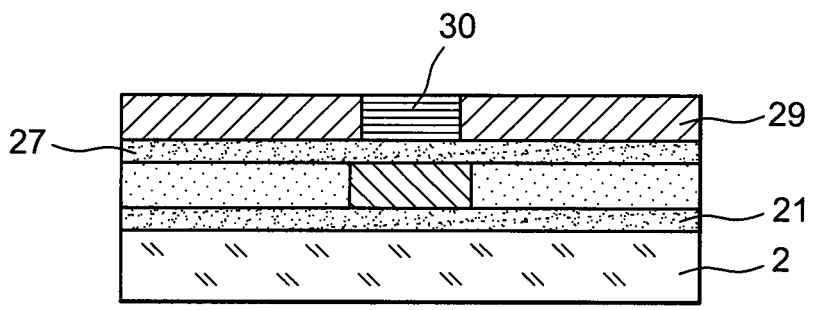

Mechanical-chemical polishing, stopping on the nitride layer, makes it possible to eliminate the lateral portions 301, 302 of magnetic layer depositions (on the non-etched zones of the layer 27) so as only to leave the portion forming the magnet 30 remaining in the cavity 290 (FIG. 12E).

As an alternative embodiment:

magnetic layers are produced, flat, and etched in the desired magnet shape, this structure is then coated with a layer which is then planarized.

On this structure, deposition of a sacrificial layer 291, for example made of titanium, approximately 50 nm thick (FIG. 12F) is performed. The thickness of this sacrificial layer will determine the gap between the mobile part 4 and the fixed part 2.

Figure 12F:
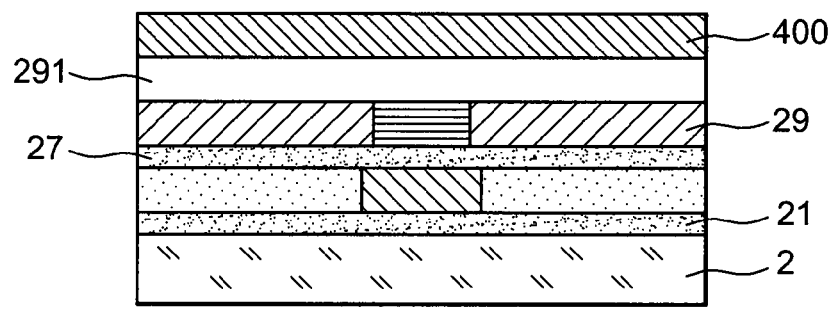

A layer 400, for example a metallic layer, an example whereof is ruthenium (Ru), is then deposited, wherein the mobile beam may be formed (FIG. 12F). This layer is substantially 50 nm thick.

Figure 12G:
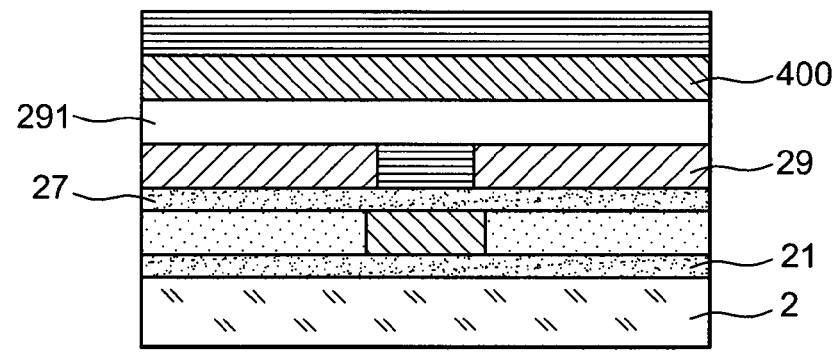
Figure 12H:
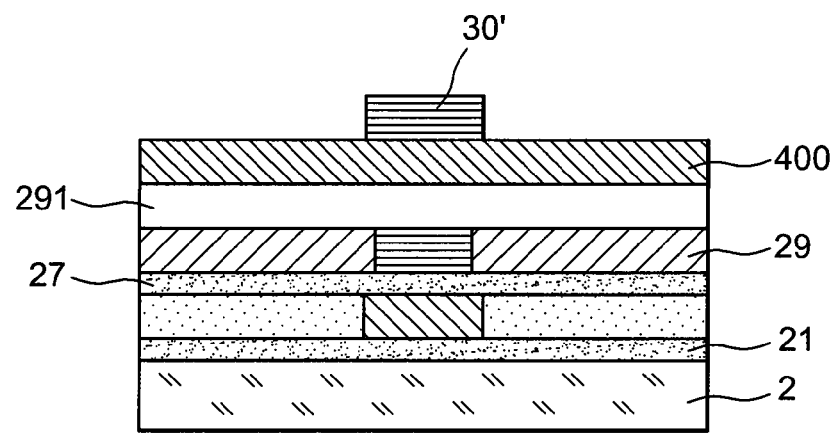

Magnetic material layers are then deposited (FIG. 12G), wherein a second magnet 30' (FIG. 12H) is produced by means of lithography and ion beam etching.

Figure 12I:
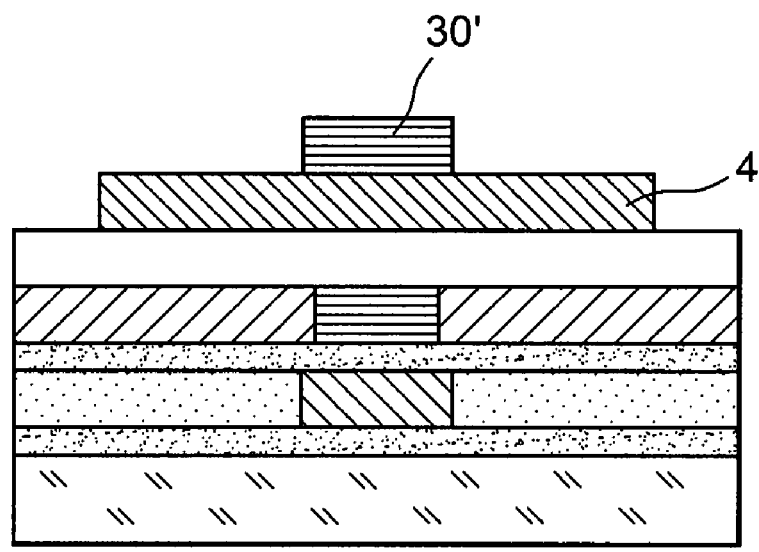

The girder 4 may then be obtained by means of lithography and etching (FIG. 12I).

Figure 12J:
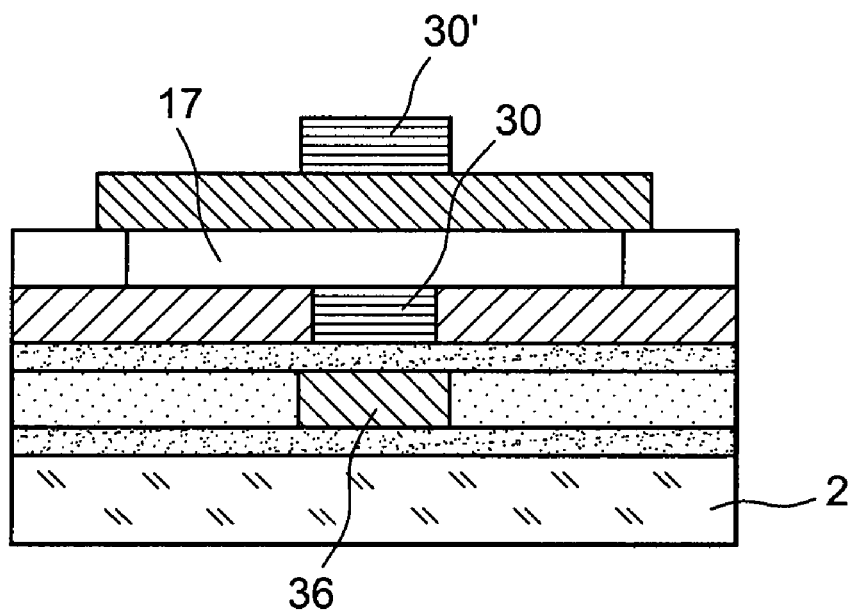

By means of plasma etching, the sacrificial layer is removed under the beam. The space or gap 17 between the mobile part and the fixed part is therefore released (FIG. 12J).

The materials of the layers apart from the manufacture of the magnet are selected as examples. It is also possible to add protective layers of the magnets in order to preserve the integrities thereof during release. It is also possible to produce two metallic layers to structure two current lines, one used for heating (integrating a TiN or GeSbTe thermistor), the other inducing the reversal field (e.g. Cu).

All the embodiments of a device according to the invention may be produced using the techniques described in the three examples above. In particular, it is possible to replace the mention of a magnet 30 or 30' (parallel magnetization) by that of a magnet 40 or 40' (perpendicular magnetization).

The typical dimensions of a nano-oscillator according to the invention are as follows:

length L (see FIG. 3A or 9A for example) of a few micrometers (for example between 1 μm and 5 μm or 10 μm), cross-section of around one hundred nanometers (for example between 10 nm×10 nm and 100 nm×50 nm, or less than 200 nm×200 nm), the gap values have already been specified above.

The invention claimed is:

1. Nano-resonator device comprising:
at least one fixed element and at least one mobile element with respect to the fixed element,
first electromagnetic means, integrated or fixed on or in the fixed element, and second electromagnetic means, integrated or fixed on or in the mobile element, to generate, in interaction with the first electromagnetic means, an oscillating movement of the mobile element,
at least one of the first or second electromagnetic means comprising plane shaped magnetic means, with magnetization in the plane thereof or perpendicular to the plane thereof,
wherein at least one of said first or second electromagnetic means comprises a stack of layers comprising an alternation of at least one magnetic layer (F) and at least one anti-ferromagnetic layer (AF).

2. Device according to claim 1:
the first electromagnetic means comprising at least one current conductor, and the second electromagnetic means comprising said plane shaped magnetic means to generate magnetization perpendicular to a direction of flow of the current in said conductor;
or the second electromagnetic means comprising at least one current conductor and the first electromagnetic means comprising said plane shaped magnetic means to generate magnetization perpendicular to a direction of flow of the current in said conductor.

3. Nano-resonator device according to claim 2, also comprising means for circulating an alternating current in the current conductor.

4. Nano-resonator device according to claim 3, the alternating current being at least one frequency equal to, or close to, a mechanical resonance frequency of the mobile part.

5. Nano-resonator device according to claim 2, said magnetic means comprising at least one plane shaped magnet, with magnetization in the plane thereof.

6. Nano-resonator device according to claim 2, the magnetic means comprising at least one plane shaped magnet, with magnetization perpendicular to the plane thereof.

7. Device according to claim 6, the perpendicular magnetization magnetic means comprising a plurality of CoPt layers.

8. Device according to claim 6, comprising means to reverse the magnetization of said perpendicular magnetization magnetic means.

9. Device according to claim 2, the current conductor being in the form of a rectilinear conductor, or in the form of a current loop.

10. Device according to claim 2, the mobile element comprising an axis (AA') of rotation, and a plane part, that can be rotated about said axis, the current conductor being integrated or fixed on the mobile element and being arranged on, or integrated in, an end portion of the axis (AA') of rotation, arranged between two magnets.

11. Device according to claim 1, the stack being limited by two external layers wherein each is an anti-ferromagnetic layer.

12. Device according to claim 1, at least one of said first or second electromagnetic means having reversible magnetization and being associated with magnetization reversal means.

13. Device according to claim 1, also comprising means for heating at least one layer of anti-ferromagnetic material (AF) above the blocking temperature of said layer.

14. Nano-resonator device according to claim 1:
the first electromagnetic means comprising first plane shaped magnetic means, with magnetization in the plane thereof, arranged on or in the fixed element;
the second electromagnetic means comprising second plane shaped magnetic means, with magnetization in the plane thereof, arranged on or in the mobile element,
at least one of the first and second magnetic means having reversible magnetization and also comprising means for reversing said magnetization.

15. Device according to claim 14, the stack being limited by two external layers wherein each is an anti-ferromagnetic layer.

16. Nano-resonator device according to claim 14, the means for reversing the magnetization comprising means for heating the layer of anti-ferromagnetic material above the blocking temperature of said layer.

17. Nano-resonator device according to claim 14, wherein motion of the mobile element is in substantially the same plane in which the fixed element lies.

18. Device according to claim 1, the mobile element being in the form of a beam or plate, wherein one end at least is fixed with respect to the fixed element.

19. Device according to claim 1, the mobile element comprising an axis (AA') of rotation, and a plane part, that can be rotated about said axis.

20. Device according to claim 1, the distance between the mobile element and the fixed element being, when the fixed element is idle, less than 100 nm or 200 nm or 1 µm.

21. Nano-resonator device comprising:
at least one fixed element and at least one mobile element with respect to the fixed element,
first electromagnetic means, integrated or fixed on or in the fixed element, and second electromagnetic means, integrated or fixed on or in the mobile element, to generate, in interaction with the first electromagnetic means, an oscillating movement of the mobile element,
at least one of the first and second electromagnetic means comprising plane shaped magnetic means, with magnetization perpendicular to the plane thereof,
wherein the magnetic means comprises at least one plane shaped magnet, with magnetization perpendicular to the plane thereof, and means to reverse said magnetization.

22. Device according to claim 21, the perpendicular magnetization magnetic means comprising a plurality of CoPt layers.

23. Device according to claim 21, the mobile element being in the form of a beam or plate, wherein one end at least is fixed with respect to the fixed element.

24. Nano-resonator device according to claim 21, wherein at least one of said first or second electromagnetic means comprises a stack of layers.

25. Device according to claim 24, the stack of layers comprising an alternation of at least one magnetic layer (F) and at least one anti-ferromagnetic layer (AF).

26. Device according to claim 21:
the first electromagnetic means comprising at least one current conductor, and the second electromagnetic means comprising said plane shaped magnetic means to generate magnetization perpendicular to a direction of flow of the current in said conductor;
or the second electromagnetic means comprising at least one current conductor and the first electromagnetic means comprising said plane shaped magnetic means to generate magnetization perpendicular to a direction of flow of the current in said conductor.

27. Nano-resonator device according to claim 26, further comprising means for circulating an alternating current in the current conductor.

28. Nano-resonator device according to claim 27, the alternating current being at least one frequency equal to, or close to, a mechanical resonance frequency of the mobile part.

29. Device according to claim 26, the current conductor being in the form of a rectilinear conductor, or in the form of a current loop.

30. Nano-resonator device comprising:
at least one fixed element and at least one mobile element with respect to the fixed element,
first electromagnetic means, integrated or fixed on or in the fixed element, and second electromagnetic means, integrated or fixed on or in the mobile element, to generate, in interaction with the first electromagnetic means, an oscillating movement of the mobile element,
at least one of the first and second electromagnetic means comprising plane shaped magnetic means, with magnetization in the plane thereof or perpendicular to the plane thereof
wherein the first electromagnetic means comprises first plane shaped magnetic means, with magnetization in the plane thereof, arranged respectively on or in the fixed element;
the second electromagnetic means comprises second plane shaped magnetic means, with magnetization in the plane thereof, arranged respectively on or in the mobile element,
and wherein at least one of the first and second magnetic means has reversible magnetization and also comprises means for reversing said magnetization.

31. Device according to claim 30:
the first electromagnetic means comprising at least one current conductor, and the second electromagnetic means comprising said plane shaped magnetic means to generate magnetization perpendicular to a direction of flow of the current in said conductor;
or the second electromagnetic means comprising at least one current conductor and the first electromagnetic means comprising said plane shaped magnetic means to generate magnetization perpendicular to a direction of flow of the current in said conductor.

32. Device according to claim 31, the mobile element comprising an axis (AA') of rotation, and a plane part, that can be rotated about said axis, the current conductor being integrated or fixed on the mobile element and being arranged on, or integrated in, an end portion of the axis (AA') of rotation, arranged between two magnets.

33. Nano-resonator device according to claim 30, wherein at least one of said first or second electromagnetic means comprises a stack of layers.

34. Device according to claim 33, the stack of layers comprising an alternation of at least one magnetic layer (F) and at least one anti-ferromagnetic layer (AF).

35. Nano-resonator device according to claim 34, the means for reversing the magnetization comprising means for heating the layer of anti-ferromagnetic material above the blocking temperature of said layer.

36. Device according to claim 33, the stack being limited by two external layers wherein each is an anti-ferromagnetic layer.

37. Nano-resonator device according to claim 30, wherein motion of the mobile element is in substantially the same plane in which the fixed element lies.

38. Device according to claim 30, the mobile element being in the form of a beam or plate, wherein one end at least is fixed with respect to the fixed element.

39. Device according to claim 30, the mobile element comprising an axis (AA') of rotation, and a plane part, that can be rotated about said axis.

40. Device according to claim 30, the distance between the mobile element and the fixed element being, when the fixed element is idle, less than 100 nm or 200 nm or 1 µm.

* * * * *